(12) United States Patent  (10) Patent No.: US 7,859,305 B2
Uno  (45) Date of Patent: Dec. 28, 2010

(54) INPUT/OUTPUT CIRCUIT

(75) Inventor: Osamu Uno, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/366,403

(22) Filed: Feb. 5, 2009

(65) Prior Publication Data

US 2009/0140770 A1  Jun. 4, 2009

Related U.S. Application Data

(63) Continuation-in-part of application No. 11/882,660, filed on Aug. 3, 2007.

(30) Foreign Application Priority Data

Aug. 7, 2006 (JP) ............................. 2006-214546
Feb. 6, 2008 (JP) ............................. 2008-26999
Aug. 29, 2008 (JP) ............................. 2008-222328

(51) Int. Cl.
H03K 19/00 (2006.01)
H03K 19/02 (2006.01)

(52) U.S. Cl. ............................. 326/58; 326/81; 326/27

(58) Field of Classification Search ............. 326/56–59, 326/80–83, 86–87; 327/534, 537, 546
See application file for complete search history.

(56) References Cited

U.S. PATENT DOCUMENTS 5,117,129 A 5/1992 Hoffman et al.
5,543,733 A 8/1996 Mattos et al.
5,844,425 A 12/1998 Nguyen et al.
6,313,672 B1 11/2001 Ajit et al.
6,803,789 B1 10/2004 Yu et al.
6,838,915 B2 1/2005 Shin
2001/0015656 A1* 8/2001 Tsuji ........................... 326/57

FOREIGN PATENT DOCUMENTS

| EP | 0 668 658 A2 | 8/1995 |
|---|---|---|
| JP | 04-329024 A | 11/1992 |
| JP | 07-066710 A | 3/1995 |
| JP | 3557694 B2 | 9/1996 |
| JP | 3441238 B2 | 12/1996 |
| JP | 3190233 B2 | 3/1997 |
| JP | 2005-210247 A | 8/2005 |

* cited by examiner

Primary Examiner—Rexford N Barnie
Assistant Examiner—Jany Tran
(74) Attorney, Agent, or Firm—Arent Fox LLP

(57) ABSTRACT

An input/output circuit, operable in an input mode and an output mode, for receiving data and an enable signal, the input/output circuit including an input/output terminal; a pull-up output transistor including a gate; a first logic circuit including an output node coupled to the gate of the pull-up output transistor; a pull-down output transistor including a gate; a second logic circuit coupled to the gate of the pull-down output transistor, and the second logic circuit inactivating the pull-down output transistor in the input mode; and a gate signal generation unit configured to generate a gate signal for inactivating the pull-up output transistor in accordance with the enable signal and an input signal provided from an external device to the input/output terminal in the input mode.

11 Claims, 17 Drawing Sheets

INPUT/OUTPUT CIRCUIT

CROSS-REFERENCE TO RELATED APPLICATIONS

This application is a continuation-in-part application of non-provisional patent application Ser. No. 11/882,660, filed on Aug. 3, 2007, which is based upon and claims the benefit of priority from prior Japanese Patent Application No. 2006-214546, filed on Aug. 7, 2006, the entire contents of both of the prior applications are incorporated herein by reference. This application is further based upon and claims the benefit of priority from prior Japanese Patent Applications No. 2008-26999, filed on Feb. 6, 2008, and 2008-222328, filed on Aug. 29, 2008, the entire contents of which are incorporated herein by reference.

FIELD

The present embodiment relates to an input/output circuit that functions in an output mode for outputting an output signal from an input/output terminal and an input mode for providing an internal circuit with an input signal input to the input/output terminal.

BACKGROUND

Nowadays, to increase integration and lower power consumption of a semiconductor device, a plurality of LSIs having different power supply voltages are connected to one another, and circuits having different power supply voltages are laid out on the same chip. Thus, a tolerant input/output circuit is used in such a semiconductor device. A tolerant input/output circuit operates with no difficulty even when inputting an input signal having a voltage higher than a power supply voltage. In such a tolerant input/output circuit, it is required that power consumption be reduced and operation frequency be improved.

FIG. 1 illustrates a tolerant input/output circuit of a first conventional example. The tolerant input/output circuit enters an output mode when an enable signal En has an L level. In the output mode, either one of output transistors P1 and N1 is activated in response to data Do. This provides an output signal, which is in phase with the data Do, from an input/output terminal Tio to an external circuit (not illustrated). The tolerant input/output circuit enters an input mode when the enable signal En has an H level. In the input mode, the output transistors P1 and N1 are both inactivated, and an input signal Di provided from the external circuit to an input/output terminal Tio is further provided to an internal circuit.

To reduce power consumption, when the tolerant input/output circuit is in a standby state, the supply of power supply voltage $V_{DD}$ is suspended regardless of the state of the external circuit connected to the input/output terminal Tio.

The P-channel MOS transistor P2 is activated in a situation in which the tolerant input/output circuit is in the standby state, the supply of power supply voltage $V_{DD}$ (3.3 V) is suspended, and input signal VIH (5 V) having a voltage higher than the power supply voltage $V_{DD}$ is input to the input/output terminal Tio as the input signal Di. In response to activation of the P-channel MOS transistor P2, the input signal VIH is applied to the gate of the output transistor P1, which is formed by a P-channel MOS transistor. Accordingly, the output transistor P1 is not activated, and a current path from the input/output terminal Tio to the source of the power supply voltage $V_{DD}$ is not formed. That is, the input/output terminal Tio does not receive the power supply voltage $V_{DD}$.

In the above-mentioned situation, a P-channel MOS transistor P3, which is included in a transfer gate 1, is activated. Activation of the transistor P3 applies the input signal VIH to the gate of a P-channel MOS transistor P4, which is included in a transfer gate 2. As a result, the P-channel MOS transistor P4 and an N-channel MOS transistor N2, which are included in a transfer gate 2, are both inactivated. Therefore, a current path connecting the input/output terminal Tio, the transistor P2, the transfer gate 2, and an NAND circuit 3 is not formed.

A back gate control circuit 4 supplies an N-well (back gate) of the transistors P1 to P4 with voltage having a level that is greater than or equal to the power supply voltage $V_{DD}$ even if the supply of power supply voltage $V_{DD}$ is suspended. This prevents the generation of a PN junction diode between the power supply voltage $V_{DD}$ and the N-well of the transistors P1 to P4.

Therefore, in a state in which the supply of the power supply voltage $V_{DD}$ is suspended, the formation of unnecessary current paths is prevented even if a high voltage input signal VIH is input to the input/output terminal Tio. In this manner, power consumption is reduced in the tolerant input/output circuit of FIG. 1.

The tolerant input/output circuit enters the input mode when the power supply voltage $V_{DD}$ is supplied and the enable signal En has an H level. In the input mode, when the input/output terminal Tio is provided with the input signal VIH having a voltage higher than the power supply voltage $V_{DD}$ by an amount that is greater than or equal to the threshold value of a P-channel MOS transistor, the transistor P2 is activated and the input signal VIH is applied to the gate of the output transistor P1. This inactivates the output transistor P1. Thus, a current path connecting the input/output terminal Tio, the output transistor P1, and the source of the power supply voltage $V_{DD}$ is not formed.

In this situation, the transistor P3 of the transfer gate 1 is activated, the input signal VIH is applied to the gate of the transistor P4 of the transfer gate 2, and the transistor P4 is inactivated. As a result, only the N-channel MOS transistor N2 is activated in the transfer gate 2, and voltage that is lower than the power supply voltage $V_{DD}$ by an amount corresponding to the threshold value of the transistor N2 is applied to the output terminal of the NAND circuit 3.

At this point of time, the enable signal En has an H level, and the output signal of the NAND circuit 3 has an H level, or the power supply voltage $V_{DD}$ level. Therefore, a current path connecting the input/output terminal Tio, the transistors P2 and N2, and the NAND circuit 3 is not formed.

Furthermore, in the input mode, the N-channel MOS transistor N3 is inactivated in response to the enable signal En having an H level. Thus, a current path connecting the input/output terminal Tio, the transfer gate 1, the transistor N3, and the ground GND is not formed. Japanese Patent No. 3557694 describes a structure similar to the input/output circuit of FIG. 1.

FIG. 2 illustrates a tolerant input/output circuit of a second conventional example described in Japanese Patent No. 3190233. In this tolerant input/output circuit, when the enable signal En has an H level, either one of the output transistors P5 and N4 is activated in accordance with the data Do, and an output signal that is in phase with the data Do is output from the input/output terminal Tio. When the enable signal En has an L level, the output transistors P5 and N4 are both inactivated, and the input signal DI provided from an external circuit to the input/output terminal Tio is further provided to an internal circuit.

To reduce power consumption, when the tolerant input/output circuit is in a standby state, the supply of power supply voltage $V_{DD}$ is suspended regardless of the state of the external circuit connected to the input/output terminal Tio.

When the tolerant input/output circuit is in the standby state and the supply of power supply voltage $V_{DD}$ (3.3 V) is suspended, if a high voltage input signal V-H is input to the input/output terminal Tio as the input signal Di, the P-channel MOS transistor P6 is activated, and the input signal VIH (5 V) is applied to the gate of the output transistor P5. However, the output transistor P5 is inactivated in this state. Thus, a current path from the input/output terminal Tio to the source of the power supply voltage $V_{DD}$ is not formed.

Furthermore, the P-channel MOS transistor P7 is activated, and the input signal VIH is applied to the gate of the P-channel MOS transistor P8. Thus, the transistor PC is inactivated. Accordingly, a current path connecting the input/output terminal Tio, the transistors P6, P8, and P9, and the source of the power supply voltage $V_{DD}$ is not formed.

In addition, the P-channel MOS transistors P10 and P11 are inactivated. Thus, the N-well of each of the transistors P5, P6, and P8 is in an indefinite state. This prevents the formation of a PN junction diode between the power supply voltage $V_{DD}$ and the N-well of the transistors P5, P6, and P8.

Similar operations are performed when the tolerant input/output circuit is in the input mode, supplied with the power supply voltage $V_{DD}$, and receives the enable signal En at an L level even if a high voltage input signal VIH is input to the input/output terminal Tio.

A pull-down resistor R1 is connected between the transistor N6 and the ground GND. When the tolerant input/output circuit shifts from the input mode to the output mode, the pull-down resistor R1 lowers the gate voltages of the transistors P8 and P'11 to the ground GND level. This quickly activates the transistors P8 and P11 and enables stable shifting to the output mode.

FIG. 3 illustrates a tolerant input/output circuit of a third conventional example described in Japanese Patent No. 3441238. The tolerant input/output circuit drives output transistors P12 and N5 in accordance with a plurality of input signals IN1 to INN.

The P-channel MOS transistor P13 is activated in a situation in which the tolerant input/output circuit is in the standby state, the supply of power supply voltage $V_{DD}$ is suspended, and a high voltage input signal VIH is input to the input/output terminal Tio. In response to activation of the P-channel MOS transistor P13, the input signal VIH is applied to the gate of the output transistor P12. However, the output transistor P12 is not activated in this state. Thus, a current path connecting the input/output terminal Tio, the output transistor P12, and the source of the power supply voltage $V_{DD}$ is not formed.

Furthermore, the P-channel MOS transistor P14 is activated, and the input signal VIH is applied to the gate of the P-channel MOS transistor P15. Thus, the transistor P15 is inactivated. Accordingly, a current path connecting the input/output terminal Tio, the transistors P13 and P15, and the source of the power supply voltage $V_{DD}$ is not formed.

Moreover, the P-channel MOS transistor P16 is activated, and the input signal VIH is applied to the N-well of the transistors P12, P13, P14, P15, P16, and P17. This prevents the formation of a PN junction diode between the power supply voltage $V_{DD}$ and the N-well of each transistor P12, P13, P14, P15, P16, and P17.

The pull-down resistor R1 is connected between the transistor N6 and the ground GND. When the tolerant input/output circuit shifts from the input mode to the output mode, the pull-down resistor R1 lowers the gate voltages of the transistors P8 and P11 to the ground GND level. This quickly activates the transistors P8 and P11 and enables stable shifting to the output mode.

FIG. 4 illustrates a fourth conventional example of a tolerant input/output circuit that enters the output mode when the enable signal En has an L level. In the output mode, either one of output transistors P12 and N7 is activated based on data Do, and an output signal, which is in phase with the data Do, is output from an input/output terminal Tio. The tolerant input output circuit enters the input mode when the enable signal En has an H level. In the input mode, the output transistors P12 and N7 are both inactivated, and an input signal Di input to the input/output terminal Tio from an external device is provided to an internal circuit.

When an input signal VIH having a voltage of 5 V, which is higher than the power supply voltage $V_{DD}$ by an amount that is greater than or equal to the threshold value of a P-channel MOS transistor, is input to the input/output terminal Tio, a transistor P13 is activated, and the input signal VIH is input to the gate of an output transistor P12.

As a result, the output transistor P12 is inactivated. Thus, a current path is not formed from the input/output terminal Tio to the power supply voltage $V_{DD}$ via the output transistor P12.

A transistor P14 is also activated, and a node N1 shifts to the input signal VIH level. This inactivates a transistor P15. Thus, current path is not formed from the input/output terminal Tio to the power supply voltage $V_{DD}$ through the transistors P13, P15, and P16.

The back gates of the output transistor P12 and the transistors P13 to P15 are clamped at the input signal VIH level by a back gate control circuit 5. This prevents formation of PN junction diode between the source power supply voltage $V_{DD}$ and the N-well of the transistors P12 to P15.

If a signal having the same level as the power supply voltage $V_{DD}$ is input to the input/output terminal Tio when the tolerant input/output circuit is supplied with power supply voltage $V_{DD}$ and selected in the input mode, the transistors P13 and P14 are inactivated, and the node N1 is shifted to the ground GND level by a pull-down resistor R2. The pull-down resistor R2 is arranged to pull down the node N1 to the ground GND level when a signal having the same level as the power supply voltage $V_{DD}$ is input to the input/output terminal Tio.

When the node N1 shifts to the GND level, the transistor P15 is activated and the transistor P16 is activated. Thus, the gate of the output transistor P12 shifts to the power supply voltage $V_{DD}$ level and the output transistor P12 is inactivated. Further, an output transistor N7 is also inactivated. Accordingly, the input/output circuit operates in the same manner as a normal CMOS input/output circuit, and the input signal Di is provided to the internal circuit.

SUMMARY

One aspect of the present invention is an input/output circuit, operable in an input mode and an output mode, for receiving data and an enable signal, the input/output circuit including an input/output terminal; a pull-up output transistor including a gate; a first logic circuit including an output node coupled to the gate of the pull-up output transistor, with the first logic circuit activating the pull-up output transistor in accordance with the data and the enable signal when the input/output circuit is in the output mode, and the first logic circuit inactivating the pull-up output transistor when the input/output circuit is in the input mode; a pull-down output transistor including a gate; a second logic circuit coupled to the gate of the pull-down output transistor, with the second logic circuit operating the pull-down output transistor in a complementary manner with respect to the pull-up output transistor in accordance with the data and the enable signal in the output mode, and the second logic circuit inactivating the pull-down output transistor in the input mode; and a gate signal generation unit configured to generate a gate signal for inactivating the pull-up output transistor in accordance with the enable signal and an input signal provided from an external device to the input/output terminal in the input mode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE EMBODIMENTS

Figure 1:
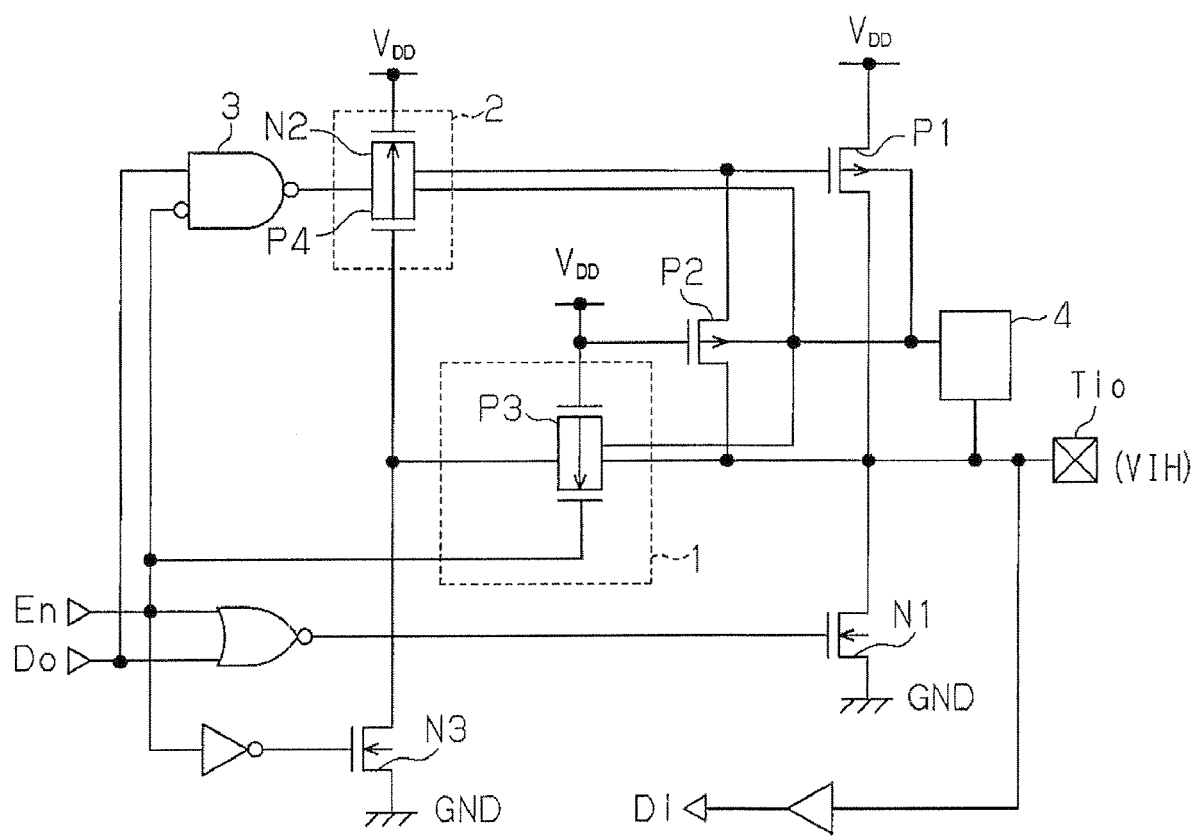
FIG. 1 is a circuit diagram of a conventional input/output circuit.

In the input/output circuit illustrated in FIG. 1, the output signal of the NAND circuit 3 is provided to the gate of the output transistor P1 via the transfer gate 2. When the output signal of the NAND circuit 3 rises from an L level to an H level, the transistor N2 of the transfer gate 2 is activated, and the gate potential at the output transistor P1 then increases. Subsequently, the transistor P4 is activated. Then, the gate potential at the output transistor P1 increases to the power supply voltage $V_{DD}$ level.

When the output signal of the NAND circuit 3 falls from an H level to an L level, the transistor P4 is activated. Then, the gate potential at the output transistor P1 decreases. Subsequently, the transistor N2 is activated, and the gate potential at the output transistor P1 decreases to an L level.

In this operation, the response of the increase and decrease of the gate potential at the output transistor P1 with respect to the rise and fall of the output signal of the NAND circuit 3 is slow due to the on-resistance of the transistors P4 and N2. In particular, when the output signal output from the input/output terminal Tio falls from an H level to an L level, the inactivation of the output transistor P1 is delayed. Thus, through current flows from the power supply voltage $V_{DD}$ to the ground GND. This increases power consumption.

The operation of the output transistor P1 cannot follow the data Do when the frequency of the data Do becomes high since the increase and decrease of the gate potential at the output transistor P1 is slow. This obstructs increase of the operation speed.

The transistors N2 and P4 of the transfer gate 2 are alternately activated when the output signal of the NAND circuit 3 rises and falls. Thus, the output signal of the transfer gate 2 provided to the gate of the output transistor P1 has a waveform that includes an inflection point near a median potential of the output signal. The inflection point slows the increase and decrease of the gate potential at the output transistor P.

Figure 2:
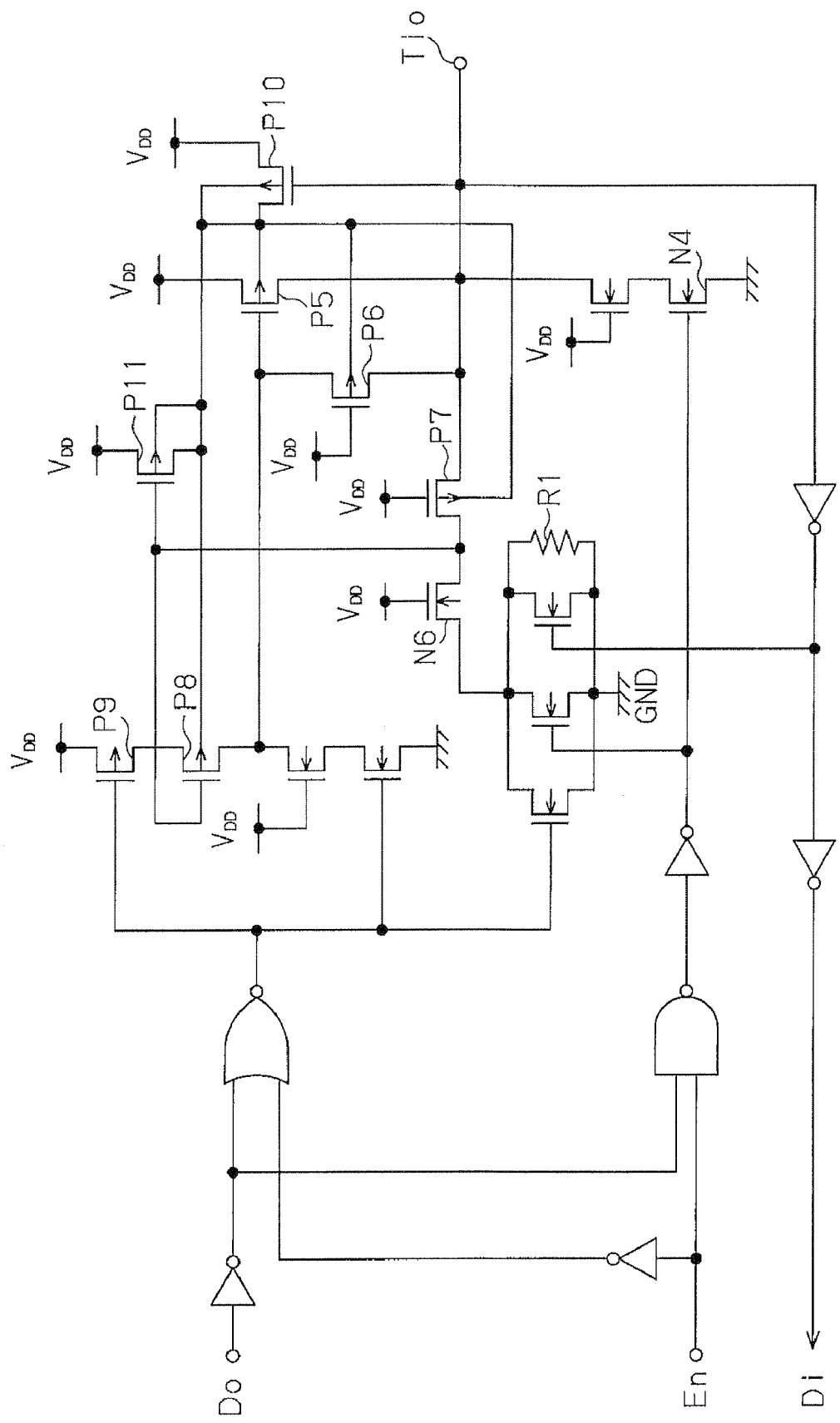
FIG. 2 is a circuit diagram of a conventional input/output circuit.

In the input/output circuit illustrated in FIG. 2, the transistors P7 and N6 are activated when high voltage input voltage VIH is input to the input/output terminal Tio during the input mode in which the power supply voltage $V_{DD}$ is supplied. This forms a current path connecting the input/output terminal Tio, transistors P7, N6, pull-down resistor R1, and the ground GND. Accordingly, power consumption increases.

There is no means for providing the input signal VIH to the N-well of the transistors P5, P6, P8, and the N-well is charged via the PN junction diode. The charging of the N-well lowers the operation speed of the transistors P1, P6, and P8.

Figure 3:
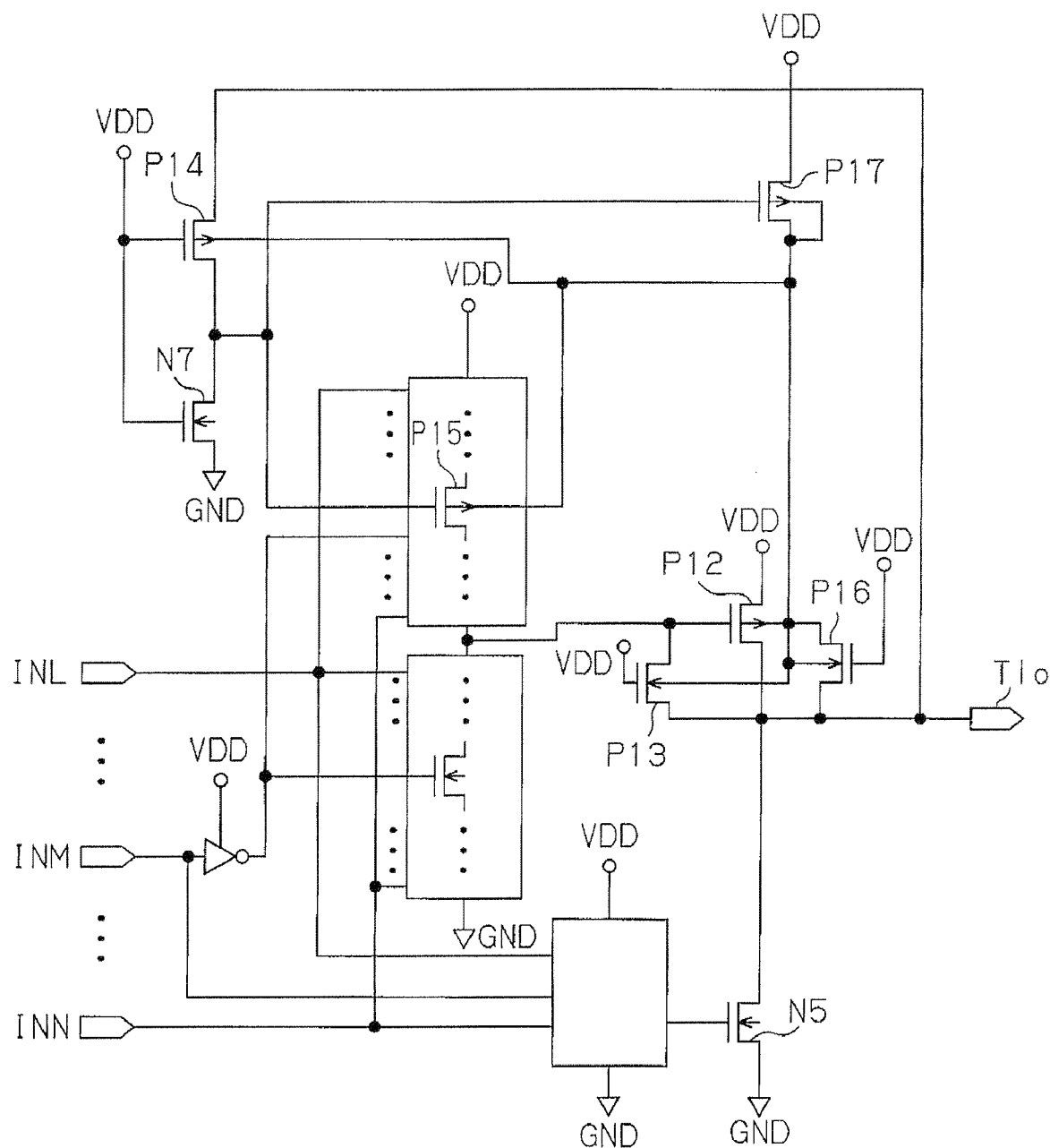
FIG. 3 is a circuit diagram of a conventional input/output circuit.

In the input/output circuit illustrated in FIG. 3, when the high voltage input signal VIH is input to the input/output terminal Tio during the input mode in which the power supply voltage $V_{DD}$ is supplied, the transistor P14 is activated. Further, the transistor N7 is normally activated. This forms a current path connecting the input/output terminal Tio, the transistors P14, N7, and the ground GND. Accordingly, power consumption increases.

Figure 4:
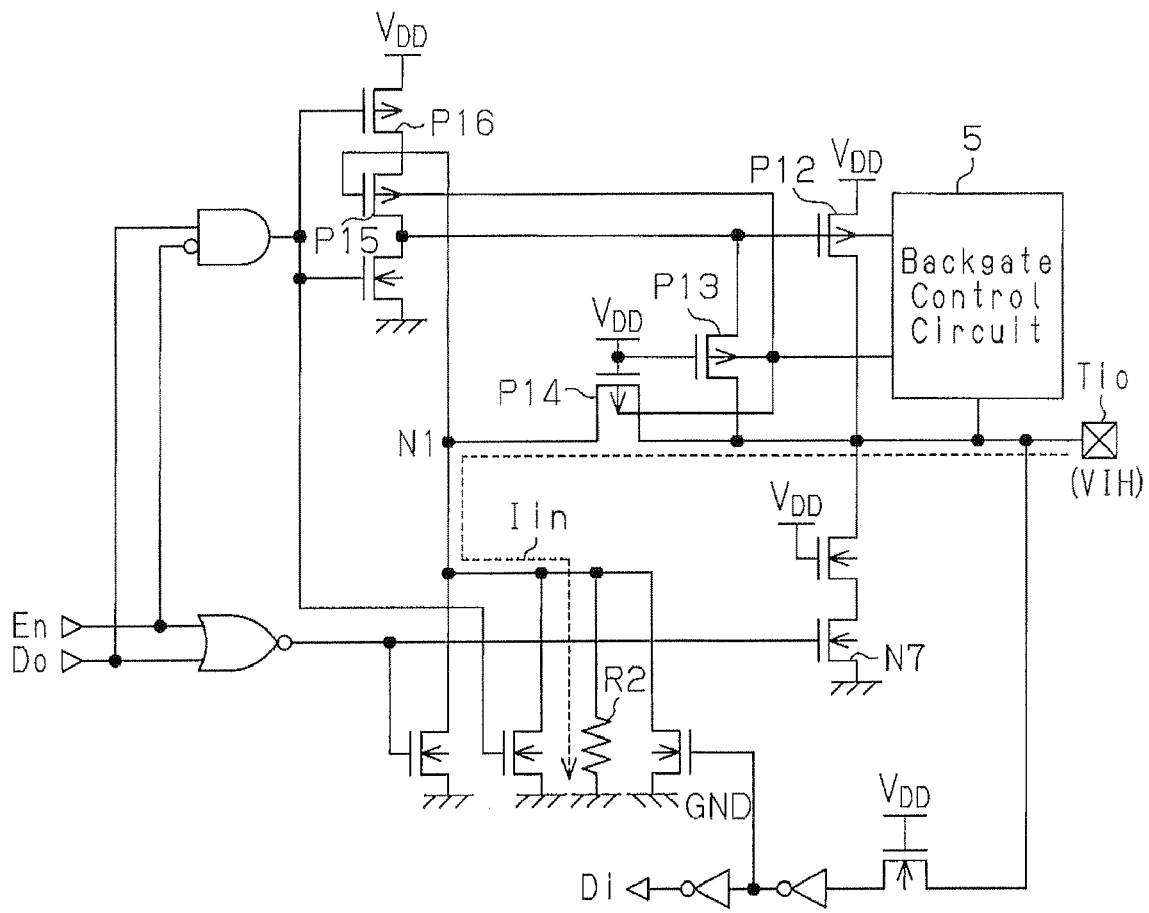
FIG. 4 is a circuit diagram of a conventional input/output circuit.
Figure 5:
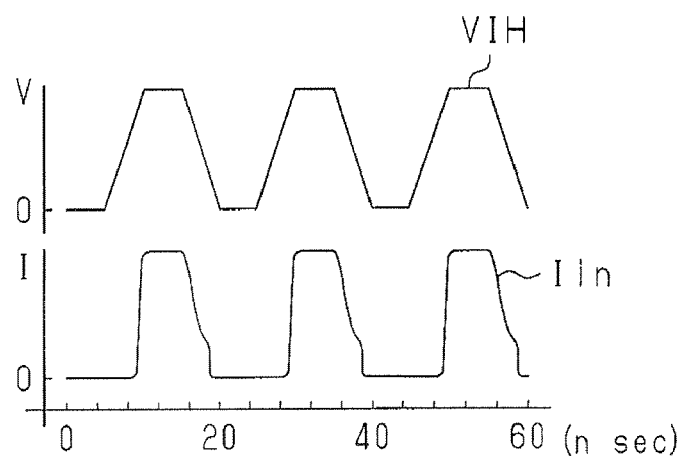
FIG. 5 is a circuit diagram of a conventional input/output circuit.

In the input/output circuit illustrated in FIG. 4, the transistor P14 is activated if the input signal (lower than or equal to power supply voltage $V_{DD}$ level) is input when the power supply voltage $V_{DD}$ is not being supplied or if the input signal VIH of 5 V is input to the input/output terminal Tio when the power supply voltage $V_{DD}$ of 3.3 V is being supplied. As illustrated in FIG. 5, a flow-in current Iin flows from the input/output terminal Tio to the ground GND via the transistor P14 and the pull-down resistor R2 whenever the input signal VIH is input. This increases power consumption.

The current value of the flow-in current Iin can be reduced by increasing the resistance value of the pull-down resistor R2. However, to increase the resistance value, the area of the pull-down resistor R2 must be increased. This affects the element layout of the input/output circuit and increases the layout area.

Japanese Laid-Open Patent Publication No. 7-66710 describes an input/output buffer circuit that prevents leakage current from flowing from an output transistor to a power supply Vcc1 during an L level output. However, in the same manner as in FIG. 1, when a voltage that is higher than the voltage of the power supply Vcc1 is input to the input/output terminal, flow-in current cannot be prevented from flowing into a NAND circuit 3. This increases power consumption.

In the same manner, an input/output buffer circuit described in Japanese Laid-Open Patent Publication No. 4-329024 cannot prevent flow-in current from flowing into an inverter circuit 3 when a voltage higher than the voltage of a power supply Vcc1 is input to the input/output terminal. This increases power consumption.

Japanese Laid-Open Patent Publication No. 2005-210247 describes an input/output tolerant circuit. When shifting from the output mode to the input mode, if the input level of an output terminal PAD cannot be lowered to a level for sufficiently activating a transistor PT1, inactivation of a transistor PT2 cannot be ensured. Thus, flow-out current may flow from the source of a power supply voltage $V_{DD}$ to the output terminal PAD. This increases power consumption.

Figure 6:
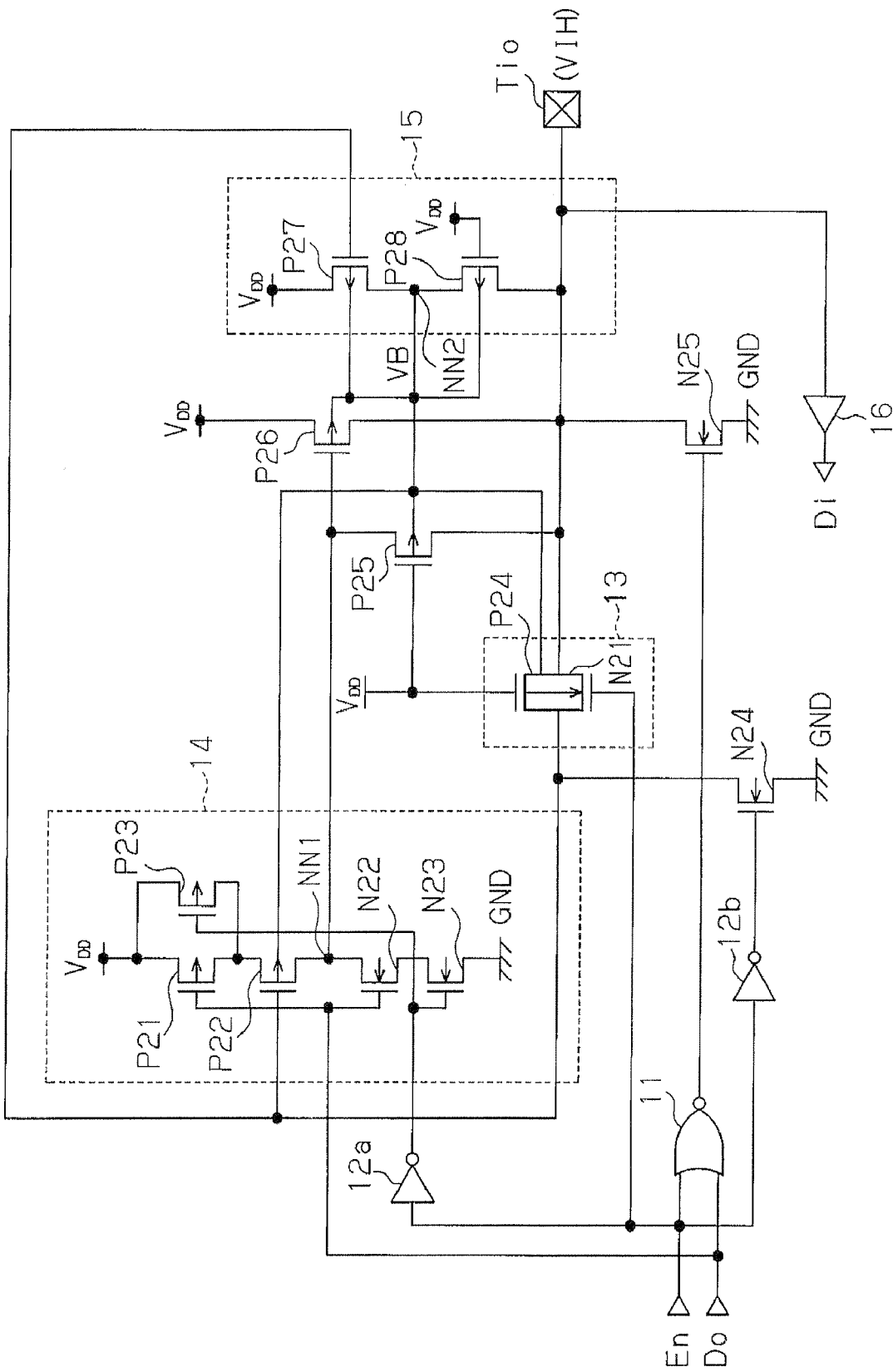
FIG. 6 is a circuit diagram of an input/output circuit according to a first embodiment of the present invention.

FIG. 6 illustrates an input/output circuit according to a first embodiment. The input/output circuit operates in an input mode and an output mode in accordance with an enable signal En and data Do. The enable signal En is provided to each of a NOR circuit (second logic circuit) 11, inverter circuits 12a and 12b, and the gate of an N-channel MOS transistor N21, which is included in a transfer gate 13.

The data Do is provided to the NOR circuit 11 and the gates of a P-channel MOS transistor P21 and an N-channel MOS transistor N22, which are included in a NAND circuit (first logic circuit) 14.

The output signal of the NOR circuit 11 is output from its output terminal and is provided to the gate of an output transistor N25, which is formed by an N-channel MOS transistor. The output signal of the inverter circuit 12b is provided to the gate of an N-channel MOS transistor N24. The source of the transistor N24 is coupled to ground GND. The drain of the transistor N24 is coupled to the gate of a P-channel MOS transistor P22, which is included in the NAND circuit 14.

The output signal of the inverter circuit 12a is provided to the gates of an N-channel MOS transistor N23 and a P-channel MOS transistor P23, which are included in the NAND circuit 14.

The NAND circuit 14 will now be described. The sources of the transistors P21 and P23 are coupled to the power supply voltage $V_{DD}$. The drains of the transistors P21 and P23 are coupled to the source of the transistor P22. The drain of the transistor P22 is coupled to the drain of the transistor N22. The source of the transistor N22 is coupled to the drain of the transistor N23. The source of the transistor N23 is coupled to ground GND. The drains of the transistors P22 and N22 are coupled to an output node NN1. The output node NN1 functions as an output terminal of the NAND circuit 14.

The NAND circuit 14 is in the output mode when the enable signal En has an L level. The L level enable signal En activates the transistor N23, inactivates the transistor P23, activates the transistor N24, and activates the transistor P22. Accordingly, the NAND circuit 14 is activated, and an inverted signal of the data Do is provided to the output node NN1.

The NAND circuit 14 is in the input mode when the enable signal En has an H level. The H level enable signal En activates the transistor P23, inactivates the transistor N23, and activates the NAND circuit 14.

The output node NN1 is coupled to the gate of the output transistor P26, which is formed by the P-channel MOS transistor. The source of the output transistor P26 is coupled to the power supply voltage $V_{DD}$. The drain of the output transistor P26 is coupled to the drain of the output transistor N25. The source of the output transistor N25 is coupled to ground GND. The drains of the output transistors P26 and N25 are coupled to the input/output terminal Tio. The transistor P26 is one example of a pull-up output transistor. The transistor N25 is one example of a pull-down output transistor.

The input/output terminal Tio is coupled to the transistor P22 of the NAND circuit 14 via the transfer gate 13. The gate of a P-channel MOS transistor P24, which is included in the transfer gate 13, is coupled to the power supply voltage $V_{DD}$.

The input/output terminal Tio is coupled to the output node NN1 by way of the P-channel MOS transistor P25. The gate of the transistor P25 is coupled to the power supply voltage $V_{DD}$.

A back gate control circuit 15 is formed by P-channel MOS transistors P27 and P28. The source of the transistor P27 is coupled to the power supply voltage $V_{DD}$. The drain of the transistor P27 is coupled to the drain of the transistor P28. The source of the transistor P28 is coupled to the input/output terminal Tio.

The gate of the transistor P27 is coupled to the gate of the transistor P22. The gate of the transistor P28 is coupled to the power supply voltage $V_{DD}$.

Back gate voltage VB is output from a connecting node NN2 of the drains of the transistors P27 and P28. The back gate voltage VB is supplied to the transistors P27 and P28 and the transistors P25, P26, P24, and P22.

The back gate control circuit 15 is in the output mode when the enable signal En has an L level. In the output mode, the transistor N24 is activated, and the transistor P27 is activated. In this case, the transistor P28 is inactivated. Therefore, the back gate voltage VB has the same level as the power supply voltage $V_{DD}$.

In the input mode in which the enable signal En has an H level, the transistor N21 of the transfer gate 13 is activated when the input/output terminal Tio shifts to an T level, or ground GND level. Thus, the transistor P27 is activated, and the back gate voltage VB becomes equal to the power supply voltage $V_{DD}$.

In the input mode, when the input/output terminal Tio shifts to an H level, that is the level of the power supply voltage $V_{DD}$, the gate voltage of the transistor P27 becomes lower than the level of the power supply voltage $V_{DD}$ by the threshold value of the transistor N21, and the transistor P27 is maintained in the activated state.

Further, in the input mode, when the input signal VIH input to the input/output terminal Tio has a voltage that is higher than the power supply voltage $V_{DD}$ by an amount greater than or equal to the threshold value of a P-channel MOS transistor, the transistor P24 is activated in the transfer gate 13, and the input signal VIH is applied to the transistor P27. This inactivates the transistor P27.

In this case, the transistor P28 is activated and the back gate voltage VB becomes equal to the voltage level of the input signal VIH.

A buffer circuit 16 is coupled to the input/output terminal Tio. A signal provided to the input/output terminal Tio in the input mode is further provided to the internal circuit via the buffer circuit 16.

The operation of the input/output circuit will now be discussed.

[Operation in Output Mode]

The enable signal En shifts to an L level when entering the output mode. This inactivates the transfer gate 13 and activates the transistor N24. Further, the NAND circuit 14 is activated, the inverted signal of the data Do is output to the output node NN1, and the inverted signal of the data Do is output from the NOR circuit 11.

As a result, either one of the output transistors P26 and N25 is activated, and an output signal that is in phase with the data Do is output from the input/output terminal Tio. In other words, the output transistor N25 is operated in a complementary manner with respect to the output transistor P26 in the output mode.

In the back gate control circuit 15, the transistor P27 is activated, the transistor P28 is inactivated, and the back gate voltage VB of the power supply voltage $V_{DD}$ level is output.

[Case in which Signal Lower than or Equal to Power Supply Voltage is Input to Input/Output Terminal Tio in Input Mode]

The enable signal En shifts to an H level when entering the input mode. As a result, the output signal of the NOR circuit 11 shifts to an L level. This inactivates the output transistor N25.

The transistor P23 is activated, the transistor N23 is inactivated, the NAND circuit 14 is inactivated, and the transistor N24 is inactivated. Furthermore, the transistor N21 of the transfer gate 13 is activated.

In this state, when a signal having an L level is input to the input/output terminal Tio, the gate of the transistor P22 is shifted to an L level via the transfer gate 13. Thus, the transistor P22 is activated, the output node NN1 shifts to an H level, and the output transistor P26 is inactivated.

The gate of the transistor P27 is shifted to an L level via the transfer gate 13. Thus, the transistor P27 is activated. Accordingly, the back gate voltage VB having the level of the power supply voltage $V_{DD}$ is output from the back gate control circuit 15.

When a signal having an H level and the same potential as the power supply voltage $V_{DD}$ level is input to the input/output terminal Tio, voltage lower than the power supply voltage $V_{DD}$ by an amount corresponding to the threshold value of the transistor N21 is supplied to the gate of the transistor P22 of the NAND circuit 14 via the transistor N21 of the transfer gate 13.

As a result, the transistor P22 maintained in the activated state, the output node NN1 is maintained at an H level, and the output transistor P26 is maintained in the inactivated state.

In the same manner, the transistor P27 is activated, and the back gate voltage VB of the power supply voltage $V_{DD}$ level is output from the back gate control circuit 15.

[Case in which Signal Higher than or Equal to Power Supply Voltage is Input to Input/Output Terminal Tio in Input Mode]

In the input mode, when the input signal VIH having a voltage higher than the power supply voltage $V_{DD}$ level by an amount greater than or equal to the threshold value of the P-channel MOS transistor is input to the input/output terminal Tio, the transistor P25 is activated, and the gate potential at the output transistor P26 becomes equal to the voltage level of the input signal VIH.

As a result, the output transistor P26 is maintained in the inactivated state even if the input signal VIH is applied to the input/output terminal Tio. Thus, a current path connecting the input/output terminal Tio, the output transistor P26, and the source of the power supply voltage $V_{DD}$ is not formed.

The transistor P24 of the transfer gate 13 is activated, and the input signal VIH is applied to the gate of the transistor P22. Thus, the transistor P22 is inactivated. Accordingly, a current path connecting the input/output terminal Tio, the transistors P25 and P22, and the source of the power supply voltage $V_{DD}$ is not formed.

The transistor N24 is inactivated. Thus, a current path connecting the input/output terminal Tio, the transistors P24 and N24, and the ground GND is also not formed.

In the back gate control circuit 15, when the input signal VIH is applied to the input/output terminal Tio, the transistor P27 is inactivated and the transistor P28 is activated. As a result, the back gate voltage VB, which is equal to the voltage of the input signal VIH, is output. As a result, formation of PN junction diode, that is, formation of a current path from the source of the power supply voltage $V_{DD}$ to the N-well is prevented in each of the transistors P27, P28, P25, P26, P24, and P22, which are supplied with the back gate voltage VB.

[Case in which Signal Higher than or Equal to Power Supply Voltage is Input to Input/Output Terminal Tio when Supply of Power Supply Voltage $V_{DD}$ is Suspended]

In a state in which the supply of power supply voltage $V_{DD}$ is suspended, if an input signal VIH having voltage higher than the power supply voltage $V_{DD}$ level by an amount greater than or equal to the threshold value of the P-channel MOS transistor is input to the input/output terminal Tio, the transistor P25 is activated, and the gate potential of the output transistor P26 becomes equal to the volt age level of the input signal VIH.

Thus, the output transistor P26 is maintained in the inactivated state even if the input signal VIH is applied to the input/output terminal Tio. Further, a current path connecting the input/output terminal Tio, the output transistor P26, and the source of the power supply voltage $V_{DD}$ is not formed.

Such an operation ensures that the transistor P25, the transfer gate 13, and the transistors P22 and P23 inactivate the output transistor P26 in the input mode. The transistor P25, the transfer gate 13, and the transistors P22 and P23 operate as a control circuit.

The transistor P24 of the transfer gate 13 is activated and the input signal VIH is applied to the gate of the transistor P22. Thus, the transistor P22 is inactivated. Accordingly, the transistor P22 serves as a switch circuit and disconnects the output node NN1 from the power supply voltage $V_{DD}$. Thus, a current path connecting the input terminal Tio, the transistors P25 and P22, and the source of the power supply voltage $V_{DD}$ is not formed.

The transistor N24 is inactivated. Thus, the current path connecting the input/output terminal Tio, the transistors P24 and N24, and the ground GND is not formed.

In the back gate control circuit 15, the transistor P27 is inactivated and the transistor P28 is activated when the input signal VIH is applied to the input/output terminal Tio. This outputs the back gate voltage VB having the voltage level of the input signal VIH. As a result, the formation of a PN junction diode, that is, the formation of the current path from the source of the power supply voltage $V_{DD}$ to the N-well is prevented in each of the transistors P27, P28, P25, P26, 24, and P22, which are supplied with the back gate voltage VB.

The input/output circuit described above has the advantages described below.

(1) In the output mode, the input/output circuit outputs the output signal in phase with the data Do from the input/output terminal Tio.

(2) In the input mode, the input/output circuit provides the input signal provided to the input/output terminal Tio to the internal circuit via the buffer circuit 16.

(3) In the input mode, an unnecessary current path is not formed from the input/output terminal Tio to the source of the power supply voltage $V_{DD}$ or the ground GND even if a signal that is lower than or equal to the power supply voltage $V_{DD}$ or higher than or equal to the power supply voltage $V_{DD}$ level is input to the input/output terminal Tio. This reduces power consumption of the input/output circuit.

(4) The NAND circuit 14 is inactivated in the input mode since the transistors P22, P23, N23 are inactivated. This prevents the formation of a current path connecting the input/output terminal Tio, the NAND circuit 14, and the source of the power supply voltage $V_{DD}$ even if a signal having a level higher than or equal to the power supply voltage $V_{DD}$ is input to the input/output terminal Tio. Thus, the power consumption of the input/output circuit is reduced.

(5) A current path connecting the output node NN1, the NAND circuit 14, and the power supply voltage $V_{DD}$ or the ground GND is prevented from being formed even if the output node NN1 of the NAND circuit 14 is directly connected to the gate of the output transistor P26. This reduces power consumption of the input/output circuit.

(6) Unlike the conventional example illustrated in FIG. 1, a transfer gate is not arranged between the output node NN1 and the output transistor P26. This enables the operation frequency of the output transistor P26 to increase.

Figure 7:
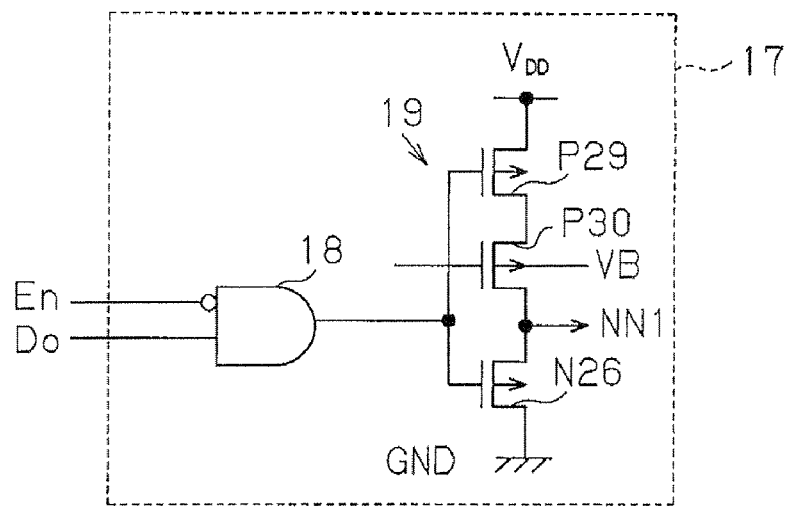
FIG. 7 is a circuit diagram of an NAND circuit arranged in an input/output circuit according to a second embodiment of the present invention.

A second embodiment will now be discussed. In the second embodiment, a NAND circuit 17 illustrated in FIG. 7 is used as the first logic circuit in lieu of the NAND circuit 14 of the first embodiment. The NAND circuit 17 is formed by an AND circuit 18 and an inverter circuit 19. Data Do and an inverted signal of the enable signal En are input to the AND circuit 18.

The inverter circuit 19 includes P-channel MOS transistors P29 and P30 and an N-channel MOS transistor N26. The source of the transistor P29 is coupled to the power supply voltage $V_{DD}$. The drain of the transistor P29 is coupled to the source of the transistor P30.

The drain of the transistor P30 is coupled to the drain of the transistor N26. The source of the transistor N26 is coupled to ground GND.

The output signal of the AND circuit 18 is input to the gates of the transistors P29 and N26. The drains of the transistors P30 and N26 are coupled to the output node NN1. In the same manner as the transistor P22 of the first embodiment, the gate of the transistor P30 is coupled to the drain of the transistor N24 and coupled to the input/output terminal Tio via the transfer gate 13. The back gate voltage VB is supplied from the back gate control circuit 15 to the back gate of the transistor P30. The parts other than the NAND circuit 17 are the same as the first embodiment.

In the NAND circuit 17, when the enable signal En shifts to an L level in the output mode, a signal in phase with the data Do is output from the AND circuit 18. Further, the transistor P30 is activated. Thus, the inverted signal of the output signal of the AND circuit 18 is output from the inverter circuit 19 to the output node NN1.

When the enable signal En shifts to an H level in the input mode, the output signal of the AND circuit 18 shifts to an L level. Thus, the transistor N26 is inactivated in the inverter circuit 19.

In this state, even when an input signal VIH that is higher than the power supply voltage $V_{DD}$ is input to the input/output terminal Tio and the input signal VIH is provided to the output node NN1, the input signal VIH is applied to the gate of the transistor P30. Thus, a current path connecting the output node NN1, the transistor P30, and the source of the power supply voltage $V_{DD}$ is not formed. Furthermore, the transistor N26 is inactivated. Thus, a current path connecting the output node NN1, the transistor N26, and the ground GND is also not formed.

The NAND circuit 17 operates in the same manner as the NAND circuit 14 of the first embodiment. Further, only the N-channel MOS transistor N26 is arranged between the output node NN1 and ground GND. Thus, the falling speed of the output node NN1 increases, and the time required to shift the output transistor P26 from an inactivated state to an activated state is shortened. Accordingly, the operation frequency of the input/output circuit may be increased.

Figure 8:
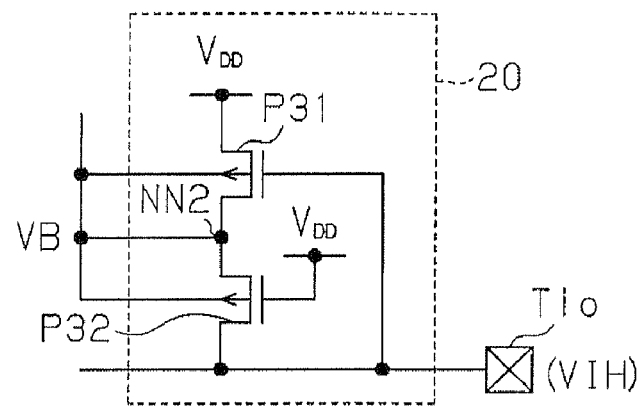
FIG. 8 is a circuit diagram of a back gate control circuit arranged in an input/output circuit according to a third embodiment of the present invention.

A third embodiment will now be discussed. In the third embodiment, a back gate control circuit 20 of FIG. 8 is used in lieu of the back gate control circuit 15 of the first embodiment. The back gate control circuit 20 includes P-channel MOS transistors P31 and P32. The back gate control circuit 20 is similar to the back gate control circuit 15 of the first embodiment except in that the gate of the transistor P31 is coupled to the input/output terminal Tio.

In such a structure, when the input/output terminal Tio shifts to an L level, the transistor P31 is activated and the transistor P32 is inactivated. Thus, the back gate control circuit 20 outputs back gate voltage VB having the level of the power supply voltage $V_{DD}$.

When input signal VIH having a voltage higher than the power supply voltage $V_{DD}$ by an amount greater than or equal to the threshold value of the P-channel MOS transistor is input to the input/output terminal Tio, the transistor P31 is inactivated, the transistor P32 is activated, and the back gate voltage VB having the voltage level of the input signal VIH is output from the back gate control circuit 20.

Due to the above operation, the back gate control circuit 20 has the same advantages as the back gate control circuit 15 of the first embodiment.

The above embodiments may be modified as described below.

The NAND circuit 14 and the NOR circuit 11 may be changed to other logic circuits in accordance with the logic of the enable signal En and the data Do.

In a so-called three state output terminal that provide an L level, H level, and high impedance output states, the buffer circuit 16 may be omitted from each of the above embodiments when connecting the output terminal to a signal wire having a level that is higher than or equal to the level of the power supply voltage $V_{DD}$ in the high impedance state or a state in which the supply of power supply voltage $V_{DD}$ is suspended.

Before describing fourth and fifth embodiments, a referential example will be described with reference to FIGS. 9 and 10.

Figure 9:
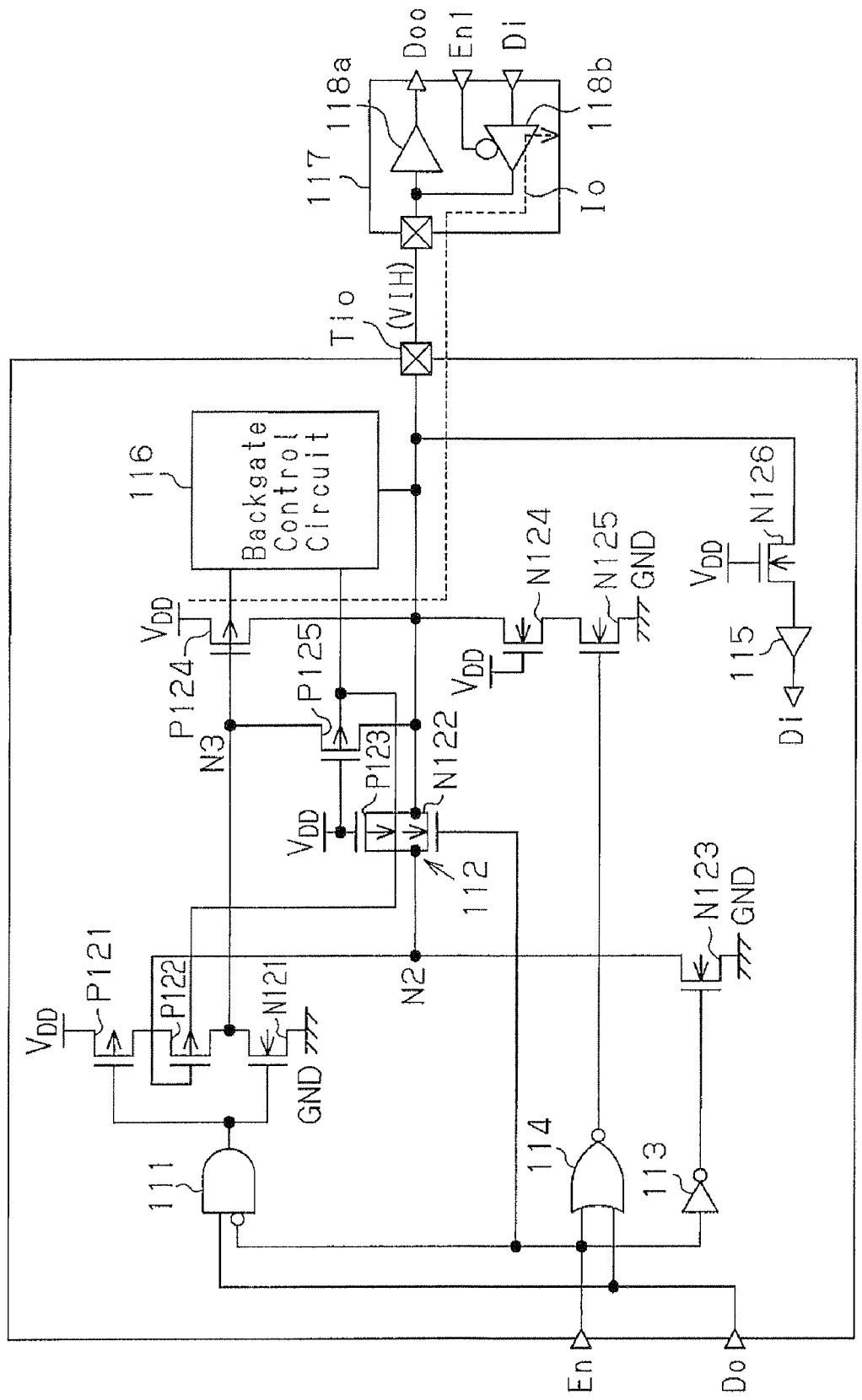
FIG. 9 is a circuit diagram of a tolerant input/output circuit according to a referential example of the present invention.

FIG. 9 illustrates a tolerant input/output circuit according to a referential example. An enable signal En and data Do are input to the tolerant input/output circuit. If the enable signal En has an L level, the tolerant input/output circuit operates in the output mode, and an output signal Doo, which is in phase with the data Do, is output from the input/output terminal Tio.

If the enable signal En has an H level, the tolerant input/output circuit operates in the input mode, and the input signal Di input to the input/output terminal Tio from an external device is provided to an internal circuit.

An inverted signal of the enable signal En and the data Do are input to an AND circuit 111. If the enable signal En has an L level, the AND circuit 111 outputs a signal, which is in phase with the data Do. If the enable signal En has an H level, the output signal of the AND circuit 111 is fixed at the L level.

The output signal from the AND circuit 111 is input to the gates of a P-channel MOS transistor P121 and an N-channel MOS transistor N121. The source of the transistor P121 is coupled to the source of a power supply voltage $V_{DD}$ (high potential power supply voltage) of 3.3 V. The drain of the transistor P121 is coupled to the drain of the transistor N121 by a P-channel MOS transistor P122 (switch circuit). The source of the transistor N121 is coupled to ground GND.

A P-channel MOS transistor P123 and an N-channel MOS transistor N122 are coupled in parallel to form a transfer gate 112. The gate of the transistor P122 is coupled to the input/output terminal Tio by the transfer gate 112. The gate of the transistor P122 is also coupled to ground GND by an N-channel MOS transistor N123.

The source of the power supply voltage $V_{DD}$ is coupled to the gate of the transistor P123, and the enable signal En is input to the gate of the transistor N122. The enable signal En is inverted in an inverter circuit 113. The inverted signal of the enable signal En is input to the gate of the transistor N123.

Accordingly, when the enable signal En shifts to an L level, the transistor N123 is activated, the transistor N122 is inactivated, the node N2 shifts to the ground GND level, and the transistor P122 is activated.

The transistor P123 is activated when the input signal VIH having a voltage higher than the power supply voltage $V_{DD}$ by an amount that is greater than or equal to the threshold value of the transistor P123 is input to the input/output terminal Tio. However, such a situation does not occur in the output mode.

A node N3 is coupled to the drains of the transistors P122 and N121 and the gate of a pull-up output transistor P124. The source of the transistor P124 is coupled to the source of the power supply voltage $V_{DD}$, and the drain of the transistor P124 is coupled to the input/output terminal Tio.

The enable signal En and the data Do are input to an NOR circuit 114. An output signal of the NOR circuit 114 is input to the gate of a pull-down output transistor N125. The pull-down output transistor N125 has a source coupled to ground GND and a drain coupled to the input/output terminal Tio by an N-channel MOS transistor N124. The transistor N124 has a gate coupled to the source of the power supply voltage $V_{DD}$ and is activated when supplied with the power supply voltage $V_{DD}$.

When the enable signal En shifts to an L level and the tolerant input/output circuit operates in the output mode, the inverted signal of the data Do is output from the NOR circuit 114. When the enable signal En shifts to an N level and the tolerant input/output circuit operates in the input mode, the output signal of the NOR circuit 114 is fixed at an L level.

Therefore, in the output mode, the output signal of the NOR circuit 114 shifts to an L level when the data Do shifts to an H level. This inactivates the pull-down output transistor N125. In this state, the pull-up output transistor P124 is activated. Thus, the H level output signal Doo is output from the input/output terminal Tio.

The output signal of the NOR circuit 114 shifts to an H level when the data Do shifts to an L level. This activates the pull-down output transistor N125. In this state, the pull-up output transistor P124 is inactivated. Thus, the L level output signal Doo is output from the input/output terminal Tio.

In the input mode, the output signal of the NOR circuit 114 shifts to an L level. This inactivates the pull-down output transistor N125.

The input signal Di input to the input/output terminal Tio is provided to the internal circuit via the N-channel MOS transistor N126 and a buffer circuit 115. The transistor N126 is activated when supplied with the power supply voltage $V_{DD}$.

A P-channel MOS transistor P125 is coupled between the node N3 and the input/output terminal Tio. The gate of the transistor P125 is coupled to the source of the power supply voltage $V_{DD}$. The transistor P125 is activated when the input signal VIH input to the input/output terminal Tio has a voltage that is higher than the power supply voltage $V_{DD}$ by an amount that is greater than or equal to the threshold value of the transistor P125. This inactivates the pull-up output transistor P124.

Back gate voltage is supplied from a back gate control circuit 116 to the back gates of the transistors P122, P123, P124, and P125. This prevents the formation of PN junction diodes between the source of the power supply voltage $V_{DD}$ and N-wells of the transistors P122, P123, P124, and P125.

An external input/output circuit 117 is coupled to the input/output terminal Tio. The external input/output circuit 117 includes a buffer circuit 118*a*, which outputs the output signal Doo in the output mode, and a buffer circuit 118*b*, which is activated by an enable signal En1 in the input mode to output the input signal Di to the input/output terminal Tio.

The operation of the tolerant input/output circuit illustrated in FIG. 9 will now be described.

When the enable signal En shifts to an L level to enter the output mode, the node N2 substantially shifts to the ground GND level. This activates the transistor P122. In this state, the gate voltages of the output transistors P124 and N125 both have an H level or L level in accordance with the data Do. This activates either one of the output transistors P124 and N125, and the output signal Doo, which is in phase with the data Do, is output from the input/output terminal Tio.

When the enable signal En shifts to an H level to enter the input mode, the transistor P121 and the transistor N122 of the transfer gate 112 are activated. This inactivates the transistors N121 and N123 and the pull-down output transistor N125.

In this state, if the L level input signal Di is input to the input/output terminal Tio, the node N2 shifts to an L level. This activates the transistor P122. Further, the node N3 shifts to an H level and inactivates the pull-up output transistor P124. As a result, the input signal Di is provided to the internal circuit via the transistor N126 and the buffer circuit 115.

If the H level signal having the power supply voltage $V_{DD}$ level is input to the input/output terminal Tio, the node N2 shifts to a level lowered from the power supply voltage $V_{DD}$ level by a threshold value of the transistor N122. This activates the transistor P122. The node N3 then shifts to an H level and the pull-up output transistor P124 is inactivated. Further, the input signal Di is provided to the internal circuit via the transistor N126 and the buffer circuit 115.

When the input signal is input to the input/output terminal Tio, the transistor P123 is activated and the node N2 shifts to the power supply voltage $V_{DD}$ level. This inactivates the transistor P122. However, the transistor P125 is activated and the node N3 shifts to the power supply voltage $V_{DD}$ level. This inactivates the pull-up output transistor P124. The input signal Di is provided to the internal circuit via the transistor N126 and the buffer circuit 115.

In the tolerant input/output circuit, if the threshold value of the transistor N122 of the transfer gate 112 is small due to manufacturing variations, flow-out current may flow from the source of the power supply voltage $V_{DD}$ to the external input/output circuit 117 when switching from the output mode to the input mode.

Figure 10:
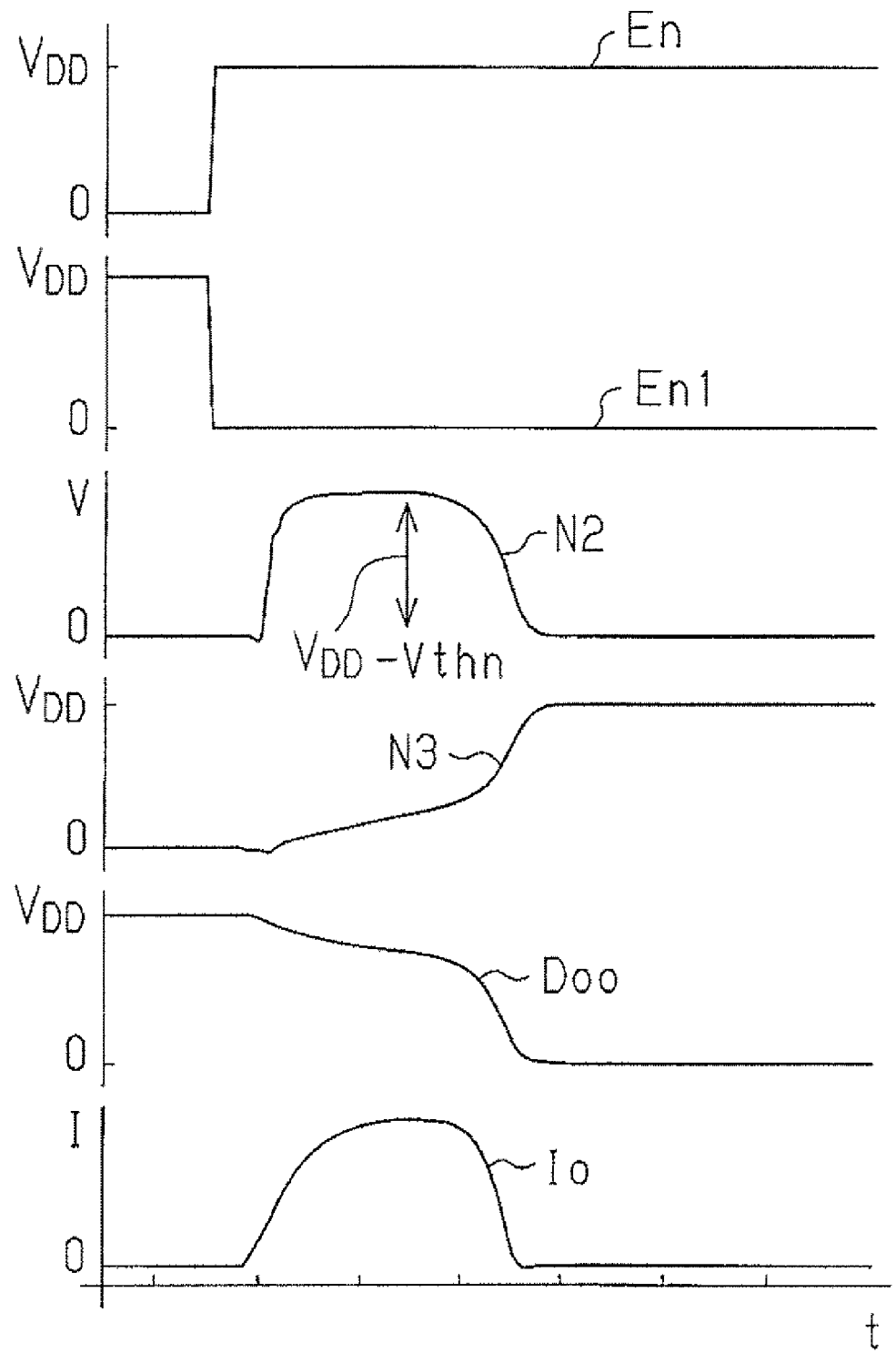
FIG. 10 is a waveform chart illustrating the operation of the tolerant input/output circuit according to the referential example of the present invention.

More specifically, referring to FIG. 10, the transistor N122 of the transfer gate is activated when switching to the input mode from the output mode in a state in which the node N3 is shifted to an L level and the transistor P124 is activated to output an H level output signal Doo.

The input/output terminal Tio has an H level. Thus, the potential at the node N2 temporarily rises to the level that is lowered from the power supply voltage $V_{DD}$ level by the threshold value Vthn of the transistor N122, and the potential of the node N2 shifts to an L level when the input signal Di shifts to an L level.

In this state, if the threshold value Vthn of the transistor N122 has an appropriate value, the transistor P122 is activated at the same time as when switching to the input mode. This inactivates the pull-up output transistor P124. However, if the threshold value Vthn of the transistor N122 is small due to manufacturing variations, the potential at the node N2 becomes high, and activation of the transistor P122 cannot be ensured.

This delays potential rise at the node N3, which in turn delays inactivation of the pull-up output transistor P124. In this state, if the buffer circuit 118d of the external input/output circuit 117 outputs the L level input signal Di in this state, flow-out current Io flows from the source of the power supply voltage $V_{DD}$ to the buffer circuit 118b via the pull-up output transistor P124 and the input/output terminal Tio. Accordingly, power consumption cannot be sufficiently reduced.

Figure 11:
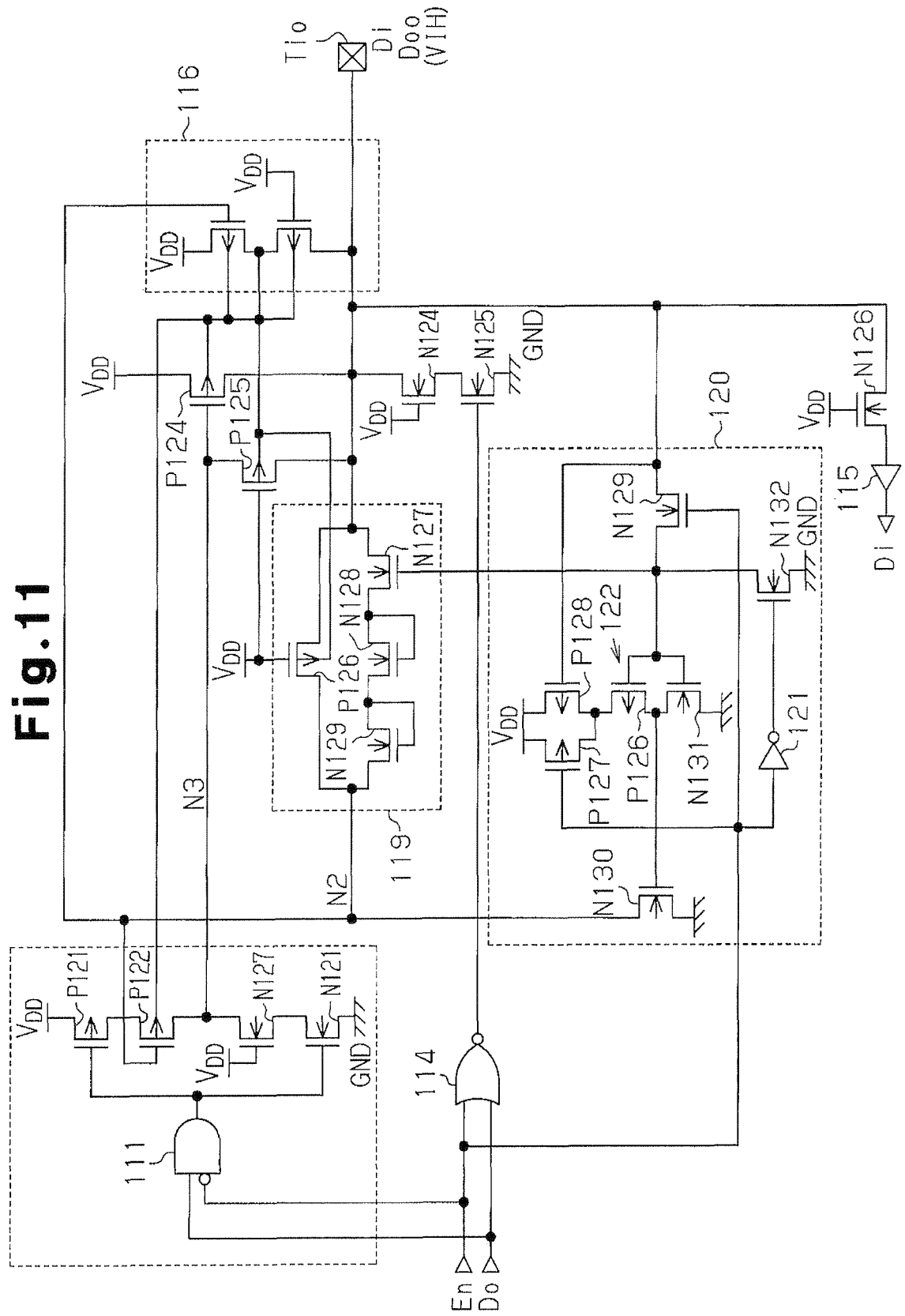
FIG. 11 is a circuit diagram of an input/output circuit according to a fourth embodiment of the present invention.

FIG. 11 illustrates a fourth embodiment. To avoid redundancy, like or same reference numerals are given to those components that are the same as the corresponding components of the referential example illustrated in FIG. 9. Such components will not be described in detail. In the same manner as the referential example of FIG. 9, the enable signal En has an L level in the output mode and an H level in the input mode.

In the fourth embodiment, the AND circuit 111 and the transistors P121, P122, N121, and N127 operate as a first logic circuit. The node N3 is the output node of the first logic circuit. The NOR circuit 114 operates as a second logic circuit.

In the fourth embodiment, the transfer gate (gate signal generation unit) 112 of the tolerant input/output circuit illustrated in FIG. 9 is changed to a transfer gate 119 illustrated in FIG. 11. Further, a control circuit (gate signal generation unit) 120 is added to control the potential at the node N2. A transistor N127 coupled between the node N3 and the transistor N121 has a gate coupled to the source of the power supply voltage $V_{DD}$ and is normally activated.

The transfer gate 119 is coupled between the node N2 and the input/output terminal Tio. The transfer gate 119 includes a P-channel MOS transistor P126 and three N-channel MOS transistors N127, N128, and N129. The three N-channel MOS transistors N127, N128, and N129 are coupled in series. The P-channel MOS transistor P126 of the transfer gate 119 is coupled in parallel to the three N-channel MOS transistors N127, N128, and N129.

The gate of the transistor P126 in the transfer gate 119 is coupled to the source of the power supply voltage $V_{DD}$. The gate of the transistor N127 is coupled to the drain of an N-channel MOS transistor N132 of the control circuit 120. Each of the transistors N128 and N129 have a gate and drain that are coupled to each other. The transistors N128 and N129 operate as diodes (voltage drop unit).

The control circuit 120 will now be described. The source of the transistor N132 is coupled to ground GND. An inverted signal of the enable signal En is input to the gate of the transistor N132 via an inverter circuit 121.

The drain of the N-channel MOS transistor N132 is coupled to the input/output terminal Tio by an N-channel MOS transistor N129 of the control circuit 120. The enable signal En is input to the gate of the transistor N129 of the control circuit 120.

The drain of the transistor N132 is coupled to the input terminal of an inverter circuit 122. The output terminal of the inverter circuit 122 is coupled to the gate of an N-channel MOS transistor N130. The transistor N130 has a source coupled to ground GND and a drain coupled to the node N2.

The source of an N-channel MOS transistor N131 in the inverter circuit 122 is coupled to ground GND. The source of a P-channel MOS transistor P126 in the inverter circuit 122 is coupled to the source of the power supply voltage $V_{DD}$ by P-channel MOS transistors P127 and P128, which are connected in parallel. The enable signal En is input to the gate of the transistor P127, and the gate of the transistor P128 is coupled to the input/output terminal Tio.

Accordingly, the inverter circuit 122 is activated when the voltage level of the input/output terminal Tio shifts to an L level or when the enable signal En shifts to an L level. In the input mode in which the enable signal En has an H level, the transistor N129 of the control circuit 120 is activated, and the input signal Di is input to the inverter circuit 122 via the transistor N129 of the control circuit 120. The inverted signal of the input signal Di is input to the gate of the transistor N130.

The back gate control circuit 116 provides the transistors P122, P124, and P125 and the transistor P126 of the transfer gate 119 with the power supply voltage $V_{DD}$ or the input signal VIH as a back gate voltage. At each of the transistors P122, P124, P125 and the transistor P126 of the transfer gate 119, the formation of a PN junction diode between the source of the power supply voltage $V_{DD}$ and the N-well is prevented. Further, an external input/output circuit similar to that of FIG. 9 is coupled to the input/output terminal Tio.

The operation of the tolerant input/output circuit of FIG. 11 will now be described.

When the enable signal En shifts to an L level to enter the output mode, the transistors P127 and N132 are activated in the control circuit 120, the transistor N129 of the control circuit 120 is inactivated, and the output signal of the inverter circuit 122 is shifted to an H level to activate the transistor N130. As a result, the node N2 shifts to an L level, and the transistor P122 is activated. Further, the transistor N127 of the transfer gate 119 is inactivated.

In this state, the gate voltages of the output transistors P124 and N125 are both shifted to either an H level or an L level in accordance with the data Do. This activates either one of the output transistor P124 and N125, and the output signal Do is output in phase with the data Do from the input/output terminal Tio.

When the enable signal En shifts to an H level to enter the input mode, the transistor P121 is activated and the transistor N121 is inactivated, the transistors P127 and N13' of the control circuit 120 are inactivated, the transistor N129 of the control circuit 120 is activated, and the pull-down output transistor N125 is inactivated.

In this state, if an input signal Di having an L level is input to the input/output terminal Tio, the transistor P128 is activated in the control circuit 120, the input signal of the inverter circuit 122 is shifted to an L level, and a signal having an H level is input to the gate of the transistor N130.

As a result, the transistor N130 is activated, the node N2 shifts to an L level, the transistor P122 is activated, the node N3 shifts to an H level, and the pull-up output transistor P124 is inactivated. Such operations provide the input signal Di to the internal circuit via the transistor N126 and the buffer circuit 115.

If an H level signal having the power supply voltage $V_{DD}$ level is input to the input/output terminal Tio, the transistors P127 and P128 of the control circuit 120 are both inactivated. However, the transistor N131 is activated, and the output signal of the inverter circuit 122 is shifted to an L level. This inactivates the transistor N130.

Further, the transistor N127 of the transfer gate 119 is activated. As a result, the node N2 shifts to a level lowered from the power supply voltage $V_{DD}$ by the threshold values of the transistors N128 and N129 of the transfer gate 119, that is, a level lowered from the power supply voltage $V_{DD}$ by the threshold values of two N-channel MOS transistor (2Vthn). Accordingly, the transistor P122 is activated, the node N3 is shifted to an H level to inactivate the pull-up output transistor P124, and the input signal Di is provided to the internal circuit via the transistor N126 and the buffer circuit 115.

When the input signal VIH is input to the input/output terminal Tio, the control circuit 120 operates in the same manner as when the power supply voltage $V_{DD}$ is input to the input/output terminal Tio. The transistor P126 of the transfer gate 119 is activated and the node N2 shifts to the power supply voltage $V_{DD}$ level so that the transistor P122 is inactivated. However, the transistor P125 is activated, and the node N3 is shifted to the power supply voltage $V_{DD}$ level. This inactivates the pull-up output transistor P124. The input signal Di is provided to the internal circuit via the transistor N126 and the buffer circuit 115.

A situation in which an anomaly occurs in the tolerant input/output circuit of FIG. 9 will now be described. In this example, an H level output signal Do is being output in the output mode. From this state, the output mode is switched to the input mode and an L level input signal Di is input.

Figure 13:
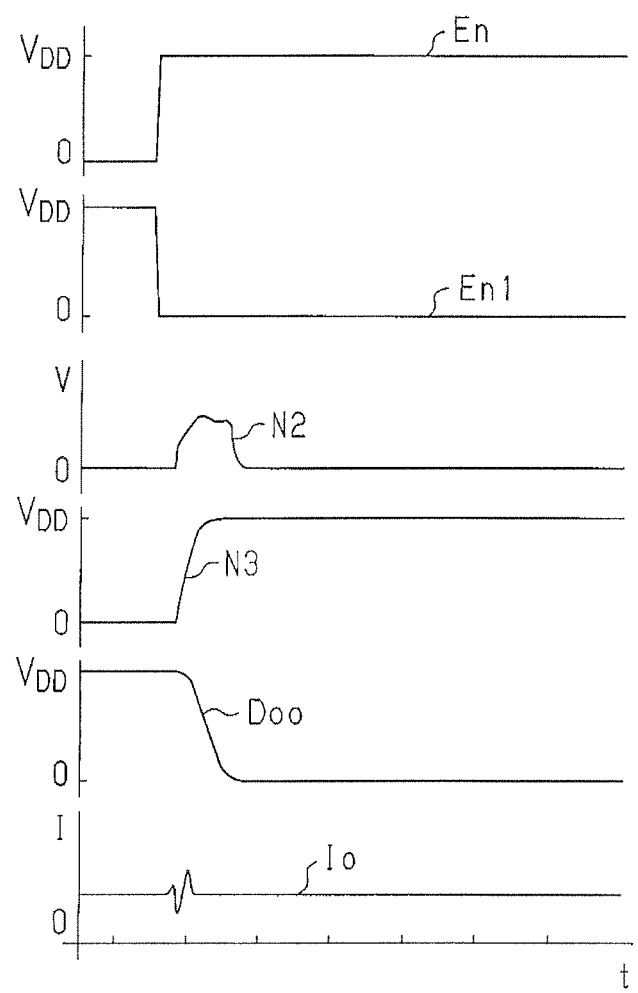

As illustrated in FIG. 13, from a state in which the transistor P124 is activated and the H level output signal Doo is being output, it the output mode is switched to the input mode, the transistor N129 of the control circuit 120 is activated. In this state, if the input/output terminal Tio has an H level, the transistor N132 is inactivated. Thus, the transistor N127 of the transfer gate 119 is activated, and the potential at the node N2 rises.

However, the potential at the node N2 rises only to the level of $V_{DD}$–2Vthn due to the operation of the transistors N128 and N129 of the transfer gate 119 that functions as a diode. Thus, the transistor P122 remains activated, current is supplied from the source of the power supply voltage $V_{DD}$ to the node N3 via the transistors P121 and P122, and the node N3 quickly rises to the power supply voltage $V_{DD}$ level.

Accordingly, even in such a situation, the pull-up output transistor P124 can be quickly inactivated when switching from the output mode to the input mode. This prevents the generation of flow-out current from the source of the power supply voltage $V_{DD}$ to the external input/output circuit although a slight switching current may flowing when the input/output terminal Tio shifts levels.

Figure 12:
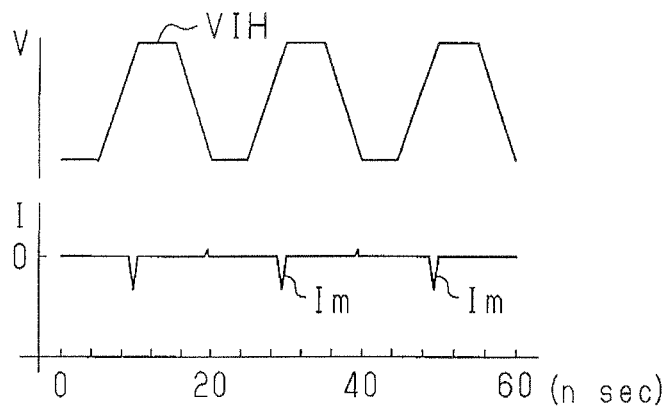
FIGS. 12 and 13 are waveform diagrams illustrating the operation of the input/output circuit according to the fourth embodiment of the present invention.

Furthermore, a pull-down resistor for lowering the potential at the node N2 is not necessary. Thus, referring to FIG. 12, flow-in current is not generated even if the input signal VIH is input, and only micro current Im flows during the switching operation to the input/output terminal Tio.

The potential at the node N2 may be referred to as the gate potential of the switch circuit (P122) or the gate potential of the transfer gate (119). The N-channel MOS transistors N129 and N130 of the control circuit 120 may be referred to as first and second N-channel MOS transistors, respectively. The transistor N127 of the transfer gate 119 may be referred to as a third N-channel MOS transistor.

The tolerant input/output circuit of FIG. 11 has the advantages described below.

(1) In the output mode, the tolerant input/output circuit outputs an output signal in phase with the data Do from the input/output terminal Tio.

(2) In the input mode, the tolerant input/output circuit provides the internal circuit with an input signal that is input to the input/output terminal Tio via the buffer circuit 115.

(3) In the input mode, the tolerant output circuit does not form an unnecessary current path that leads from the input/output terminal Tio to the source of the power supply voltage $V_{DD}$ or ground GND even if a signal lower than or equal to the power supply voltage $V_{DD}$ level or an input signal VIH higher than or equal to the power supply voltage $V_{DD}$ level is input to the input/output terminal Tin.

(4) The tolerant input/output circuit does not need a pull-down resistor for pulling down the node N2 to an L level in the input mode. Thus, even if the input signal VIH is input to the input/output terminal Tio in the input mode, flow-in current that flows from the input/output terminal Tin to ground GND is not generated.

(5) The tolerant input/output circuit includes transistors N128 and N129 of the transfer gate 119. In a state in which the tolerant input/output circuit generates an H level output during the output mode, when switching to the input mode and receiving an L level input signal, the tolerant input/output circuit adjusts the level at the node N2 to a level that sufficiently activates the transistor P122 regardless of potential manufacturing variations in the threshold value of a transistor. Accordingly, the pull-up output transistor P124 is quickly inactivated, and the generation of flow-out current flowing from the source of the power supply voltage $V_{DD}$ to the external input/output circuit is prevented.

(6) The transfer gate is not coupled between the node N3 and the pull-up output transistor P124. Thus, the operation frequency of the pull-up output transistor P124 may be increased from that of the referential example illustrated in FIG. 9.

(7) In the output mode, due to the transistor N130 of the control circuit 120, the node N2 has an L level, the transistor P122 is activated, and the inverted signal of the data Do is output to the node N3. In the input mode, if the input signal Di has an L level, the transistor N130 of the control circuit 120 is activated and the node N2 shifts to an L level. This activates the transistor P122 and inactivates the pull-up output transistor P124. If the input signal Di has an H level, the transistor N127 of the transfer gate 119 is activated, and the potential at the node N2 may be adjusted to $V_{DD}$–2Vthn. Thus, the transistor P122 may be activated to inactivate the pull-up output transistor P124.

Figure 14:
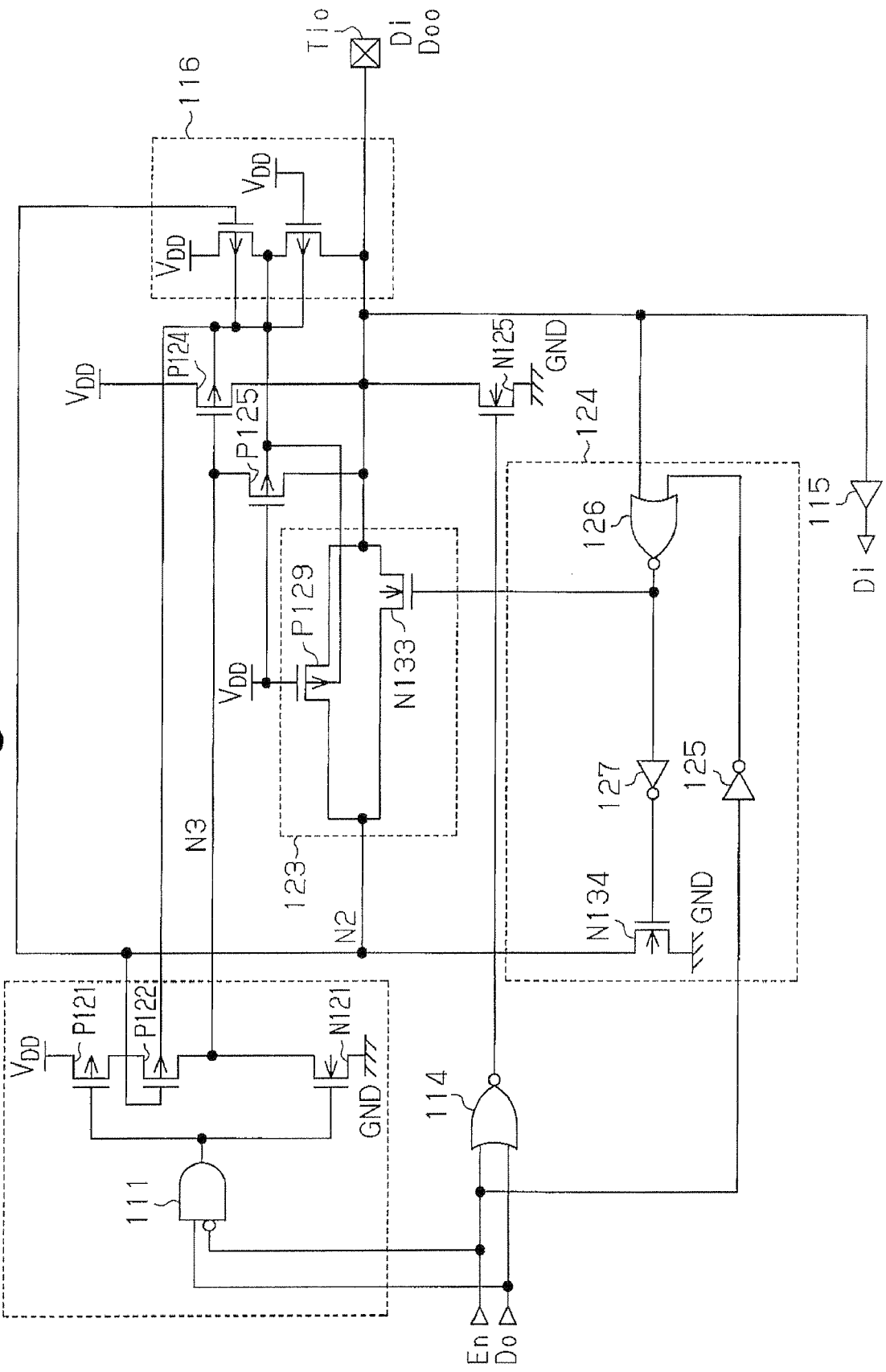
FIG. 14 is a circuit diagram of an input/output circuit according to a fifth embodiment of the present invention.

FIG. 14 illustrates a fifth embodiment. In the fifth embodiment, the transfer gate and the control circuit of the fourth embodiment are modified, and the transistor N127 of the first logic circuit and the transistors N124 and N126 are eliminated. The other parts are the same as the fourth embodiment. Like or same reference numerals are given to those components that are the same as the corresponding components of the fourth embodiment. In the fifth embodiment, the AND circuit 111 and the transistors P121, P122, and N121 operate as the first logic circuit. The NOR circuit 114 operates as the second logic circuit.

In the same manner as the fourth embodiment, the enable signal En has an L level in the output mode and an H level in the input mode. However, in the input mode, the tolerant input/output circuit is usable when voltage greater than or equal to the power supply voltage $V_{DD}$ is not supplied from an external device to the input/output terminal Tio.

A transfer gate 123 has an N-channel MOS transistor N133 and a P-channel MOS transistor P129 connected in parallel between the node N2 and the input/output terminal Tio. The gate of the transistor P129 is coupled to the source of the power supply voltage $V_{DD}$.

In a control circuit 124, an enable signal En is inverted by an inverter circuit 125 and input to one input terminal of an NOR circuit 126. The other input terminal of the NOR circuit 126 is coupled to the input/output terminal Tio. An output signal of the NOR circuit 126 is input to the gate of an N-channel MOS transistor N134 via an inverter circuit 127. The source and drain of the transistor N134 are respectively coupled to ground GND and the node N2.

The output signal of the NOR circuit 126 is input to the gate of the transistor N133 of the transfer gate 123.

The N-channel MOS transistor N134 of the control circuit 124 may be referred to as a fourth N-channel MOS transistor. The N-channel MOS transistor N133 of the transfer gate 123 may be referred to as a fifth N-channel MOS transistor.

The operation of the tolerant input/output circuit of FIG. 14 will now be described.

When the enable signal En shifts to an L level to enter the output mode, the output signal of the inverter circuit 125 in the control circuit 124 shifts to an H level, and the output signal of the NOR circuit 126 shifts to an L level. This inactivates the transistor N133 of the transfer gate 123. Further, the transistor N134 is activated in response to the output signal of the inverter circuit 127. Accordingly, the node N2 shifts to an L level, and the transistor P122 is activated.

In this state, the gate voltages of the output transistors P124 and N125 both have an H level or L level in accordance with the data Do. Thus, either one of the output transistors P124 and N125 is activated, and the output signal Do that is in phase with the data Do is output from the input/output terminal Tio.

When the enable signal En shifts to an H level to enter the input mode, the transistor P121 is activated, and the output signal of the inverter circuit 125 in the control circuit 124 shifts to an L level. Further, the pull-down output transistor N125 is inactivated.

In this state, if an L level input signal Di is input to the input/output terminal Tio, the output signal of the NOR circuit 126 shifts to an H level in the control circuit 124, and the transistor N133 of the transfer gate 123 is activated. Further, the output signal of the inverter circuit 127 shifts to an L level, and the transistor N134 is inactivated.

As a result, the node N2 shifts to an L level, the transistor P122 is activated, and the pull-up output transistor P124 is inactivated. Due to such an operation, the input signal Di is provided to the internal circuit via the transistor N126 and the buffer circuit 115.

If an H level signal having the power supply voltage $V_{DD}$ level is input to the input/output terminal Tio, the output signal of the NOR circuit 126 shifts to an L level in the control circuit 124, the transistor N133 of the transfer gate 123 is inactivated, and the transistor N134 is activated.

As a result, the node N2 shifts to an L level, the transistor P122 is activated, and the pull-up output transistor P124 is inactivated. Due to such an operation, the input signal Di is provided to the internal circuit via the transistor N126 and the buffer circuit 115.

A situation in which an anomaly occurs in the tolerant input/output circuit of FIG. 9 will now be described. In this example, an H level output signal Doo is being output in the output mode. From this state, the output mode is switched to the input mode and an L level input signal Di is input.

Figure 15:
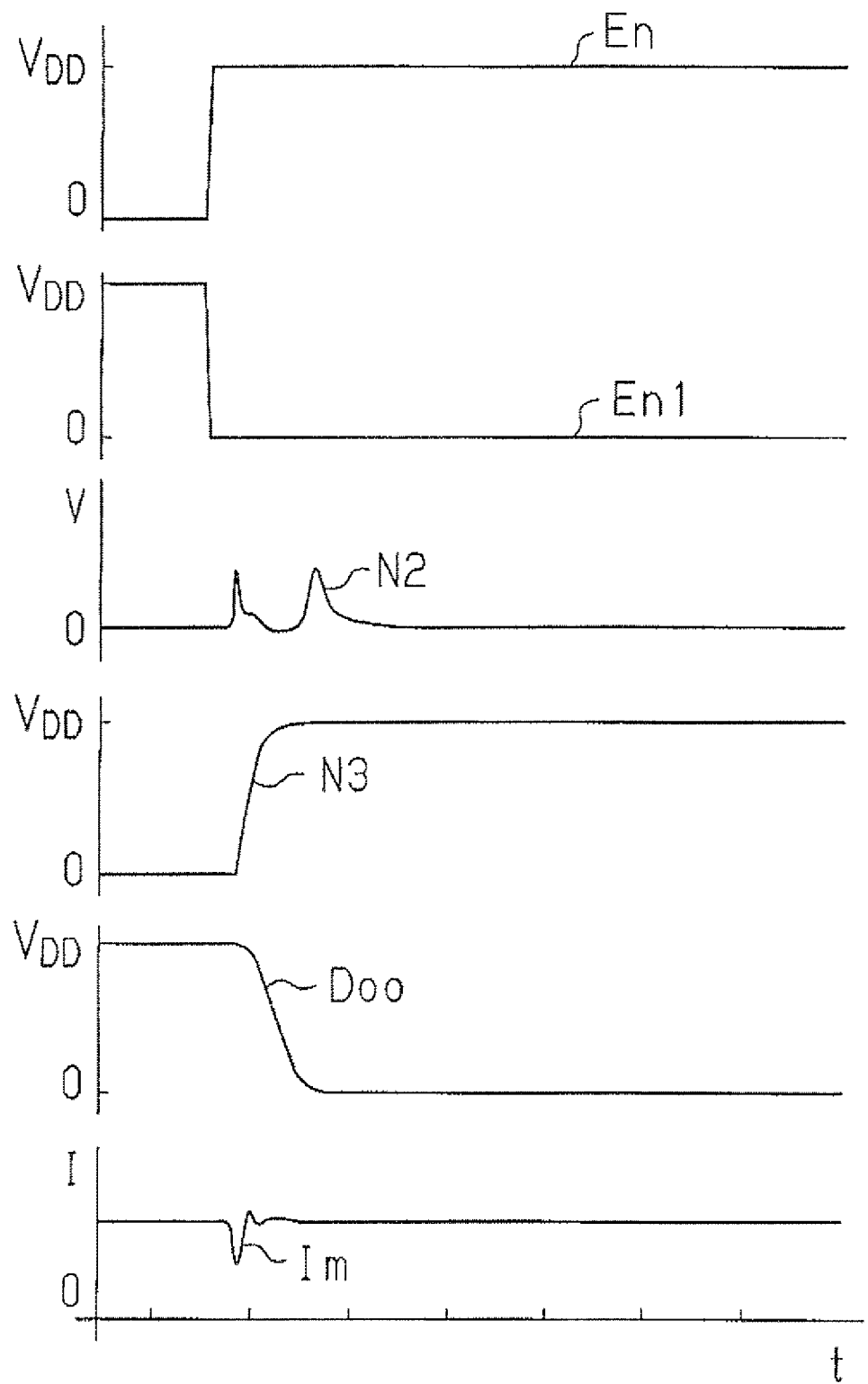
FIG. 15 is a waveform chart illustrating the operation of the input/output circuit according to the fifth embodiment of the present invention.

Referring to FIG. 15, in the output mode, the transistor P124 is activated and the H level output signal Doo is output. From this state, when switching to the input mode, the transistor P121 is activated, and the output signal of the inverter circuit 125 in the control circuit 124 shifts to an L level. When the input signal Di falls from an H level to an L level, the output signal of the NOR circuit 126 shifts to an H level, the transistor N134 is inactivated, the transistor N133 of the transfer gate 123 is activated, and the node N2 shifts to an L level.

As a result, the transistor P122 is activated, and the pull-up output transistor P124 is inactivated. Accordingly, even under such a situation, the pull-up output transistor P124 is quickly inactivated. This prevents the generation of flow-out current from the source of the power supply voltage $V_{DD}$ to the external input/output circuit via the pull-output transistor P124 although a slight switching current may flowing when the input/output terminal Tio shifts levels. Further, only micro current Im flows to the input/output terminal Tio during the switching operation.

Additionally, a pull-down resistor for lowering the potential at the node N2 is not necessary. Thus, flow-in current is not generated even if the input signal Di shifts to an H level.

The tolerant input/output circuit of FIG. 14 obtains the advantages described below.

(1) In the output mode, the tolerant input/output circuit outputs an output signal in phase with the data Do from the input/output terminal Tio.

(2) In the input mode, the tolerant input/output circuit provides the internal circuit with an input signal that is input to the input/output terminal Tio via the buffer circuit 115.

(3) In the input mode, the tolerant output circuit does not form an unnecessary current path that leads from the input/output terminal Tio to the source of the power supply voltage $V_{DD}$ or ground GND even if an H level signal having the power supply voltage $V_{DD}$ level or an L level signal is input to the input/output terminal Tio.

(4) A pull-down resistor for pulling down the node N2 to an L level during the input mode is not necessary. This prevents the generation of flow-in current that flows from the input/output terminal Tio to the ground GND even if the H level signal is input to the input/output terminal Tio in the input mode.

(5) From a state in which an output has an H level during the output mode, when switching to the input mode, if an L level input signal is input, the transistor N133 of the transfer gate 123 is activated and the node N2 shifts to an L level. Accordingly, the pull-up output transistor P124 may be quickly inactivated. This prevents the generation of flow-out current that flows from the source of the power supply voltage $V_{DD}$ to the external input/output circuit.

(6) A transfer gate is not coupled between the node N3 and the pull-up output transistor P124. Thus, the operation frequency of the pull-up output transistor P124 may be increased from that of the referential example illustrated in FIG. 9.

(7) In the output mode, the transistor N134 of the control circuit 124 shifts the node N2 to an L level and to activate the transistor P122 and output the inverted signal of the data Do to the node N3. Further, in the input mode, when the control circuit 124 shifts the input signal Di to an L level, the transistor N134 of the transfer gate 123 is activated and the node N2 shifts to an L level. Further, the transistor P122 is activated and the pull-up output transistor P124 is inactivated. When the input signal Di has an H level, the transistor N134 of the control circuit 124 is activated so that the node N2 shifts to an L level. This activates the transistor P122 and inactivates the pull-up output transistor P124.

(8) In the input mode, the node N2 shifts to an L level in accordance with the enable signal En or the input signal Di. Thus, the pull-u output transistor P124 is quickly inactivated.

(9) Less elements are required than the tolerant input/output circuit of the fourth embodiment.

A sixth embodiment will now be discussed with reference to FIGS. 16 to 19. The fourth embodiment solves the problems of the tolerant input/output circuit illustrated in FIGS. 9 and 10. The sixth embodiment further solves other problems.

The operation when the tolerant input/output circuit illustrated in FIG. 9 switches from an output mode in which it outputs an H level output signal Doo to an input mode and receives an L level input signal Di from the external output/input circuit 117 was described above with reference to FIG. 10. Hereafter, the operation when the tolerant input/output circuit illustrated in FIG. 9 switches from an output mode, in which it outputs an H level output signal Doo, to an input mode and receives an H level input signal Di from the external output/input circuit 117 will be discussed as a referential example.

Figure 20:
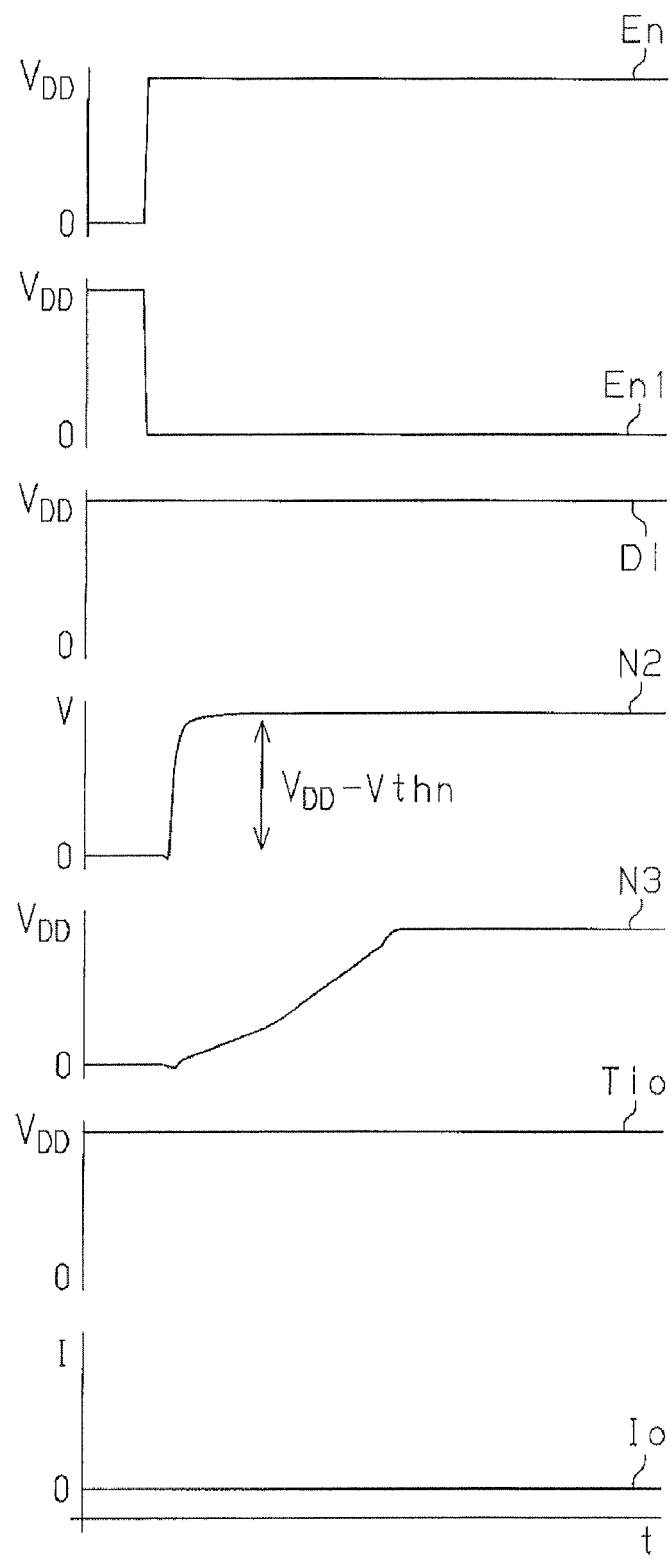
FIGS. 20 and 21 are waveform charts illustrating the operation of a tolerant input/output circuit according to a referential example of the present invention.

In a state in which the tolerant input/output circuit of FIG. 9 is outputting an H level output signal Doo in the output mode, when the enable signal En shifts to an H level and the enable signal En1 shifts to an L level, the tolerant input/output circuit enters the input mode. In this state, when the input/output terminal Tio receives an input signal Di having the power supply voltage $V_{DD}$ level from the external output/input circuit 117, the potential at node N2 is represented by $V_{DD}$–Vthn (refer to FIG. 20).

When the threshold value Vthn is normal, the transistor P122 is activated, and the potential at node N3 is increased to the power supply voltage $V_{DD}$ level, and the output transistor P124 is inactivated.

Figure 21:
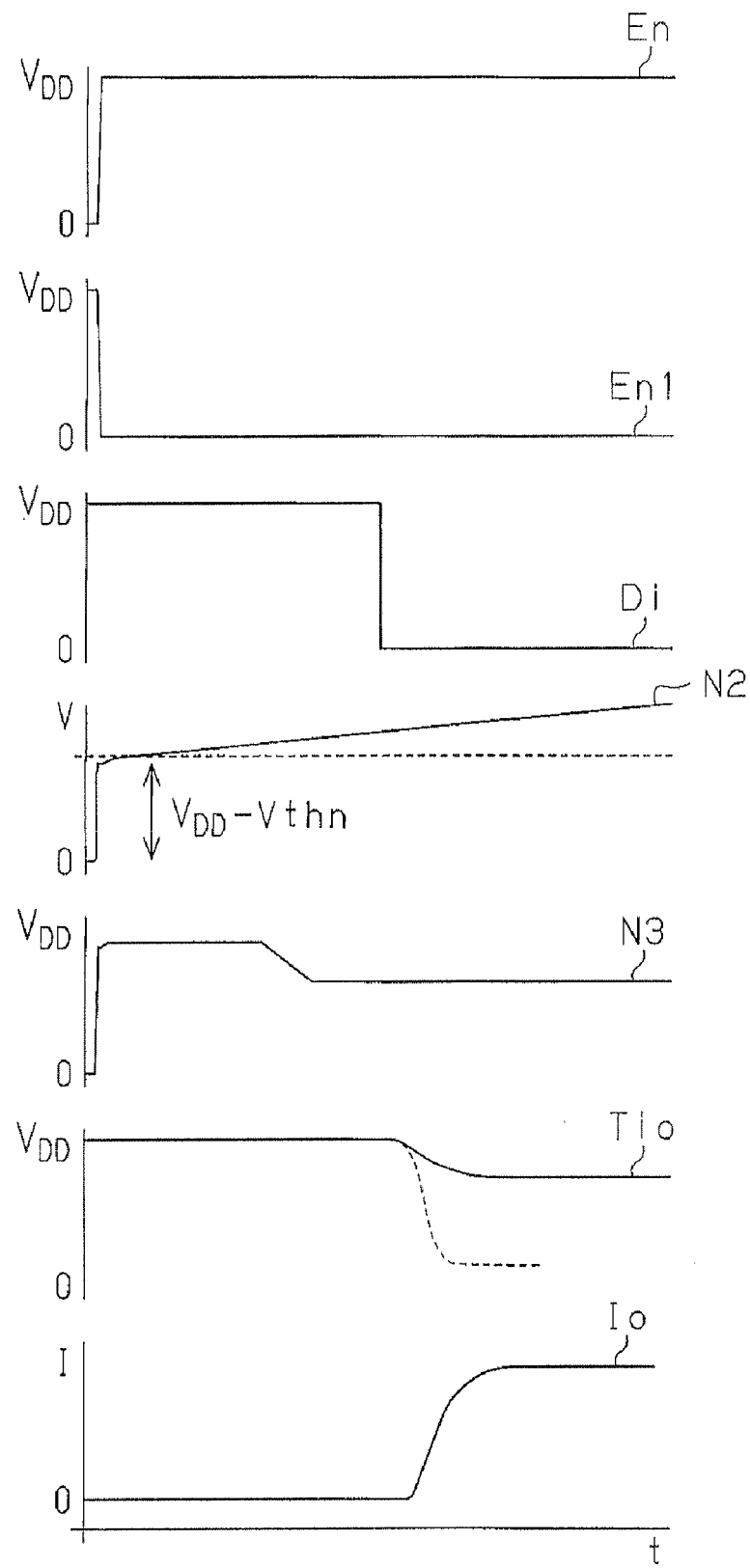

During such an operation, due to manufacturing variations and temperature characteristic variations, as illustrated in FIG. 21, when an H level input signal Di is continuously input to the input/output terminal Tio, the potential at node N2 gradually increases from $V_{DD}$–Vthn. If the potential at node N2 increases to a level near the power supply voltage $V_{DD}$, the transistor P122 may not be activated.

In such a state, the potential at node N3 first increases to the power supply voltage $V_{DD}$ level and then becomes unstable. Thus, leakage current of the transistor N121 may decrease the potential at node N3.

When the potential at node N3 decreases, the output transistor P124 is activated. In this state, when an L level input signal Di is input, flow-out current Io flows from the source of the power supply voltage $V_{DD}$ to the buffer circuit 118b via the output transistor P124 and the input/output terminal Tio.

Further, when the output impedance of the buffer circuit 118b is not sufficiently smaller than the ON resistance of the output transistor P124, the potential at the input/output terminal Tio cannot be decreased to an L level, and the input signal Di becomes erroneous data. The sixth embodiment solves this problem of the tolerant input/output circuit illustrated in FIG. 9.

Figure 16:
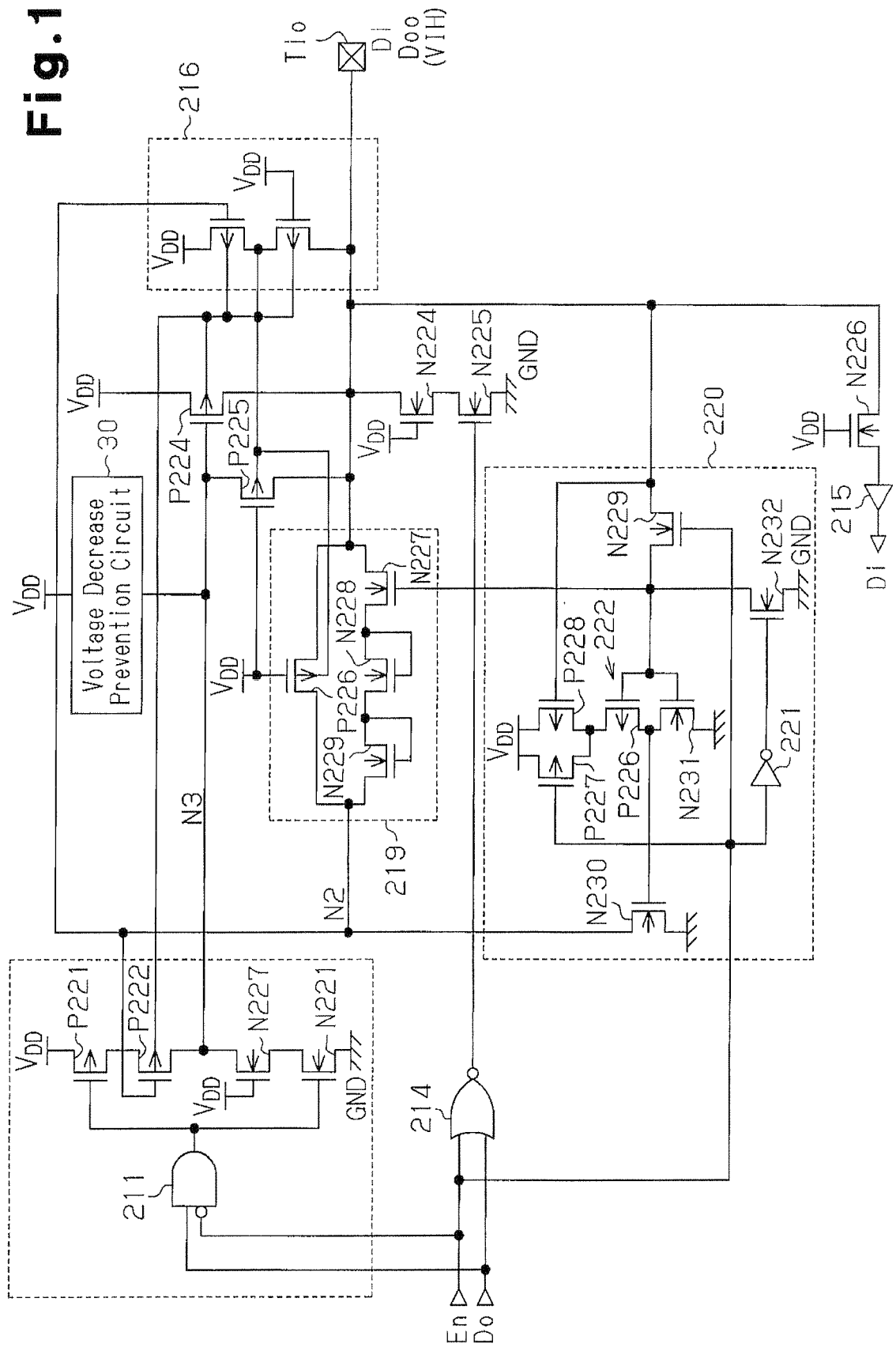
FIG. 16 is a circuit diagram of an input/output circuit according to a sixth embodiment of the present invention.

FIG. 16 illustrates a tolerant input/output circuit that is formed by connecting a voltage decrease prevention circuit 30 to node N3 in the tolerant input/output circuit of the fourth embodiment illustrated in FIG. 11. The remaining parts of the tolerant input/output circuit are the same as the fourth embodiment.

Figure 17:
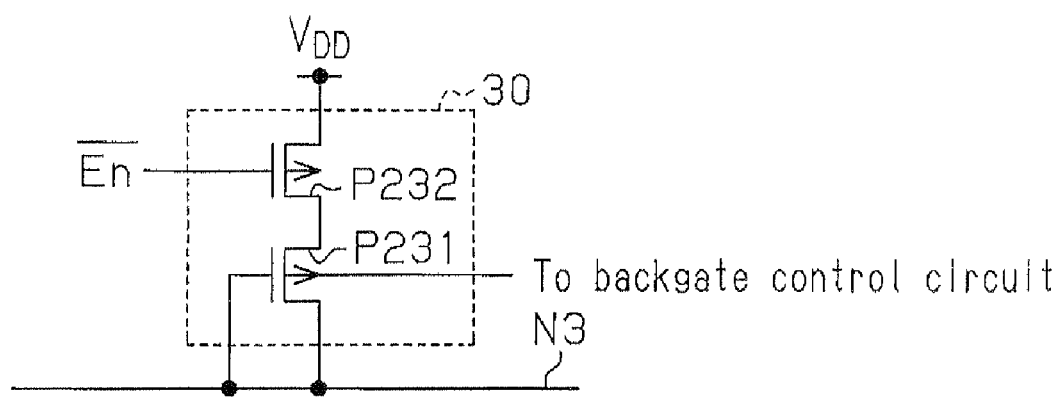
FIG. 17 is a circuit diagram of a voltage decrease prevention circuit in the sixth embodiment.

FIG. 17 illustrates the structure of the voltage decrease prevention circuit 30 in detail. As illustrated in FIG. 17, node N3 is coupled to the source of the power supply voltage $V_{DD}$ via P-channel MOS transistors P231 and P232. The gate of the transistor P231 is coupled to node N3. The gate of the transistor P232 receives an enable signal /En, which is an inverted signal of the enable signal En. The transistor P231 has a back gate supplied with back gate voltage from a back gate control circuit 216.

Figure 19:
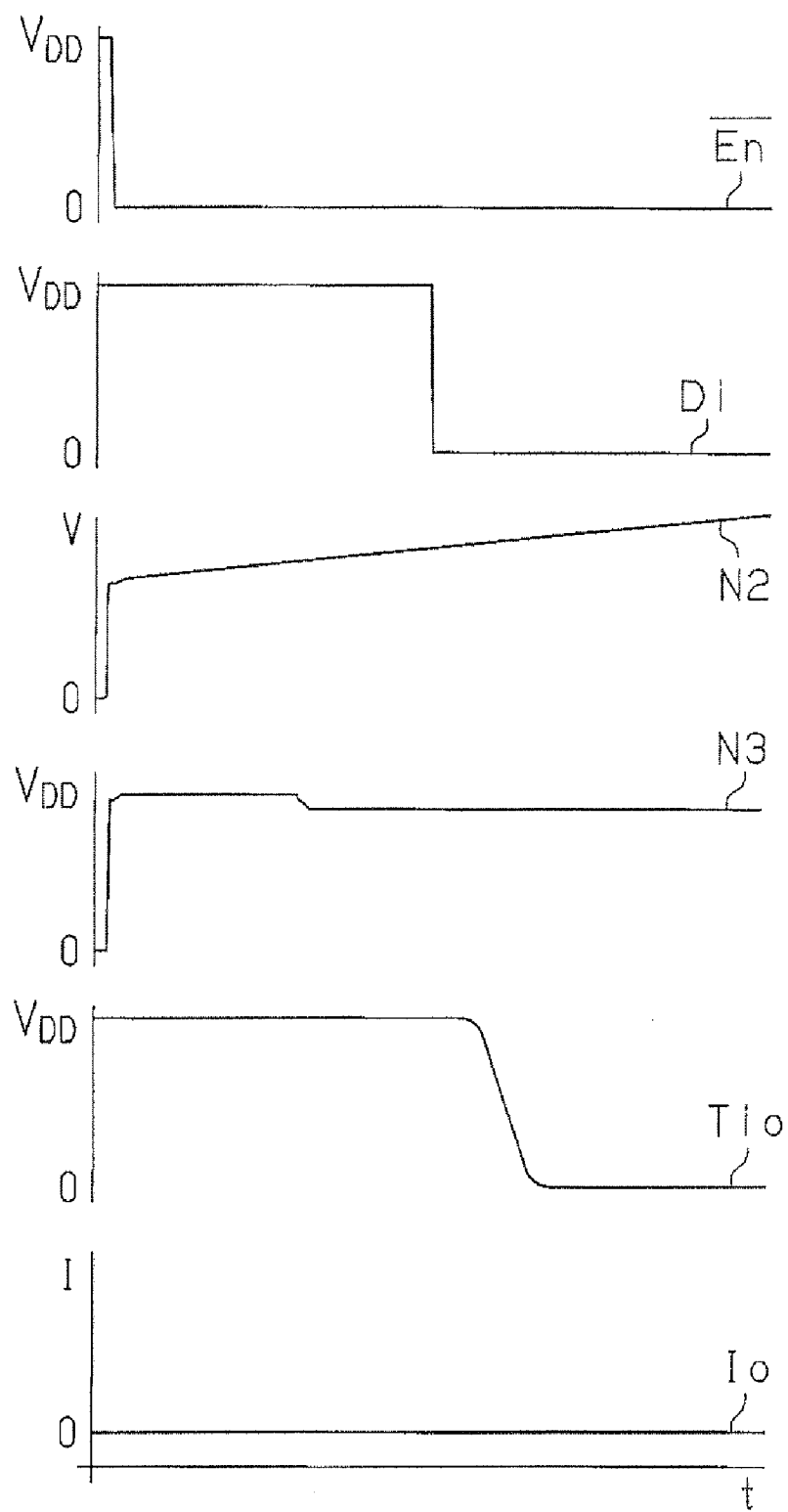
FIG. 19 is a waveform chart illustrating the operation of the input/output circuit according to the sixth embodiment of the present invention.

The operation of the voltage decrease prevention circuit 30 will now be discussed with reference to FIG. 19. In the input mode, the enable signal /En shifts to an L level and activates the transistor P232. As a result, the source potential of the transistor P231 becomes substantially equal to the power supply voltage $V_{DD}$ level.

Therefore, when the input terminal Tio receives the input signal Di having the power supply voltage $V_{DD}$ level and the potential at node N2 gradually increases, as the potential at node N3 becomes lower than the power supply voltage $V_{DD}$ by an amount corresponding to the threshold value of the transistor P231 or greater, the transistor P231 is activated. This stops the decrease of the potential at node N3.

Accordingly, output transistor P224 remains inactivated. Thus, even if the input signal Di shifts to an L level, flow-out current Io is not generated. Further, when the input signal Di shifts to an L level, the input/output terminal Tio quickly shifts to an L level. This allows the input signal Di to be accurately input.

During the output mode, the enable signal /En has an H level. Thus, the transistor P232 is inactivated. Further, even if node N3 becomes greater than or equal to the power supply voltage $V_{DD}$ level, the transistor P231 is not activated. Accordingly, current does not flow into the source of the power supply voltage $V_{DD}$ from node N3.

Figure 18:
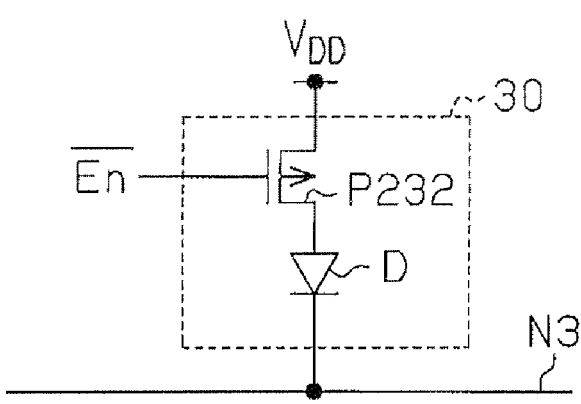
FIG. 18 is a circuit diagram illustrating a further example of a voltage decrease prevention circuit.

FIG. 18 illustrates a modification of the voltage decrease prevention circuit 30 illustrated in FIG. 17. The voltage decrease prevention circuit 30 of FIG. 18 uses a diode D in lieu of the transistor P231. This obtains the same advantages as the circuit of FIG. 17.

The fourth through sixth embodiments may be modified as described below.

The tolerant input/output circuit of the fourth or sixth embodiment and the tolerant input/output circuit of the fifth embodiment may be arranged on the same chip. In this case, the tolerant input/output circuit of the fourth or sixth embodiment is used when the input signal VIH is input to the input/output terminal Tio. Further, the tolerant input/output circuit of the fifth embodiment is used when the input signal VIH is not input to the input/output terminal Tio.

With a so-called three-state output terminal that realizes L level, H level, and high impedance output states, when the output terminal is coupled to a signal line having voltage greater than or equal to the power supply voltage $V_{DD}$ level in a high impedance state or in a state in which the supply of the power supply voltage $V_{DD}$ is suspended, the buffer circuit 115 may be eliminated from the tolerant input/output circuit of the fourth embodiment, the fifth embodiment, or the sixth embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An input/output circuit, operable in an input mode and an output mode, for receiving data and an enable signal, the input/output circuit comprising:
an input/output terminal;
a pull-up output transistor including a gate;
a first logic circuit including an output node coupled to the gate of the pull-up output transistor, with the first logic circuit activating the pull-up output transistor in accordance with the data and the enable signal when the input/output circuit is in the output mode, and the first logic circuit inactivating the pull-up output transistor when the input/output circuit is in the input mode;
a pull-down output transistor including a gate;
a second logic circuit coupled to the gate of the pull-down output transistor, with the second logic circuit operating the pull-down output transistor in a complementary manner with respect to the pull-up output transistor in accordance with the data and the enable signal in the output mode, and the second logic circuit inactivating the pull-down output transistor in the input mode; and
a gate signal generation unit configured to generate a gate signal for inactivating the pull-up output transistor in accordance with the enable signal and an input signal provided from an external device to the input/output terminal in the input mode, wherein the gate signal generation unit includes:
a switch circuit coupled between a high potential power supply and the gate of the pull-up output transistor;
a transfer gate coupled between a gate of the switch circuit and the input/output terminal; and
a control circuit which controls the transfer gate and the switch circuit in accordance with both the enable signal and the input signal provided to the input/output terminal in the input mode.

2. The input/output circuit according to claim 1, wherein:
the input/output circuit is for use with the high potential power supply;
the pull-up output transistor is a P-channel MOS transistor; and
wherein the control circuit which controls a gate potential at the transfer gate and the switch circuit in accordance with the enable signal and the input signal.

3. The input/output circuit according to claim 2, wherein:
the transfer gate includes a voltage drop unit including a plurality of series-connected diodes; and
the control circuit provides, when the input signal has an H level, the input signal to the gate of the switch circuit via the voltage drop unit of the transfer gate, and the control circuit lowers the gate of the switch circuit to an L level when the input signal has an L level.

4. The input/output circuit according to claim 3, wherein:
the control circuit includes:
a first N-channel MOS transistor activated in accordance with the enable signal in the input mode to provide the input signal to an input terminal of an inverter circuit and the transfer gate; and
a second N-channel MOS transistor operated in accordance with an output signal from the inverter circuit, with the second N-channel MOS transistor being activated when the input signal has an L level to lower the gate of the switch circuit to an L level; and
the transfer gate includes a third N-channel MOS transistor activated when the input signal has an H level to provide the input signal to the voltage drop unit.

5. The input/output circuit according to claim 2, wherein the control circuit lowers the gate of the switch circuit to an L level when the input signal has an H level, and provides the input signal to the gate of the switch circuit via the transfer gate when the input signal has an L level.

6. The input/output circuit according to claim 5, wherein:
the control circuit includes:
an NOR circuit provided with an inverted signal of the enable signal and the input signal; and
a fourth N-channel MOS transistor which receives an inverted signal of an output signal of the NOR circuit and which is activated when the input signal has an H level to lower the gate of the switch circuit to an L level; and
the transfer gate includes a fifth N-channel MOS transistor having a gate for receiving the output signal of the NOR circuit, with the fifth N-channel MOS transistor being activated when the input signal has an L level to provide the input signal to the gate of the switch circuit.

7. The input/output circuit according to claim 3, wherein the gate signal generation unit includes a P-channel MOS transistor coupled between the input/output terminal and the gate of the pull-up output transistor, with the P-channel MOS transistor being activated when the input signal input to the input/output terminal has a voltage higher than the high potential power supply voltage.

8. The input/output circuit according to claim 5, wherein the gate signal generation unit includes a P-channel MOS transistor coupled between the input/output terminal and the gate of the pull-up output transistor, with the P-channel MOS transistor being activated when the input signal input to the input/output terminal has a voltage higher than the high potential power supply voltage.

9. The input/output circuit according to claim 2, further comprising:
a voltage decrease prevention circuit coupled to the gate of the pull-up output transistor, wherein the voltage decrease prevention circuit maintains the gate potential during the input mode at a potential that inactivates the pull-up output transistor.

10. The input/output circuit according to claim 9, wherein the voltage decrease prevention circuit includes two P-channel MOS transistors coupled in series between the high potential power supply and the gate of the pull-up output transistor, with one of the two P-channel MOS transistors having a gate provided with an inverted signal of the enable signal, and the other one of the P-channel MOS transistors having a gate coupled to the gate of the pull-up output transistor.

11. The input/output circuit according to claim 9, wherein the voltage decrease prevention circuit includes a P-channel MOS transistor and a diode connected in series between the high potential power supply and the gate of the pull-up output transistor, with the P-channel MOS transistor having a gate provided with an inverted signal of the enable signal, and the diode having a cathode coupled to the gate of the pull-up output transistor.

* * * * *